United States Patent
Kim et al.

(10) Patent No.: US 12,016,211 B2
(45) Date of Patent: *Jun. 18, 2024

(54) DISPLAY DEVICE

(71) Applicant: SAMSUNG DISPLAY CO., LTD., Yongin-si (KR)

(72) Inventors: Yeon Hong Kim, Hwaseong-si (KR); Eun Hye Ko, Yongin-si (KR); Eun Hyun Kim, Suwon-si (KR); Kyoung Won Lee, Seoul (KR); Sun Hee Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,844

(22) Filed: Jan. 30, 2023

(65) Prior Publication Data
US 2023/0180545 A1  Jun. 8, 2023

Related U.S. Application Data

(63) Continuation of application No. 17/223,984, filed on Apr. 6, 2021, now Pat. No. 11,569,328.

(30) Foreign Application Priority Data

Jul. 16, 2020  (KR) ........................ 10-2020-0087975

(51) Int. Cl.
*H10K 59/126* (2023.01)
*G09G 3/3208* (2016.01)
(Continued)

(52) U.S. Cl.
CPC ....... *H10K 59/126* (2023.02); *H10K 59/1315* (2023.02); *H01L 27/124* (2013.01); *H10K 59/1201* (2023.02); *H10K 59/1213* (2023.02)

(58) Field of Classification Search
CPC ............. H01L 27/3272; H01L 27/3279; H01L 27/124; H01L 27/3262; H01L 2227/323;
(Continued)

(56) References Cited

U.S. PATENT DOCUMENTS 8,158,975 B2 * 4/2012 Akimoto ............. H01L 29/7869
257/43
10,050,132 B2  8/2018 Yamazaki et al.
(Continued)

FOREIGN PATENT DOCUMENTS

KR  10-2016-0055648 A  5/2016
KR  10-2016-0098497 A  8/2016
(Continued)

*Primary Examiner* — Mohsen Ahmadi
(74) *Attorney, Agent, or Firm* — Lewis Roca Rothgerber Christie LLP

(57) ABSTRACT

A display device includes a substrate, a corrosion prevention layer on the substrate and including an inorganic material, a first conductive layer on the corrosion prevention layer and including aluminum or an aluminum alloy, a first insulating film on the first conductive layer, a semiconductor layer on the first insulating film and including a channel region of a transistor, a second insulating film on the semiconductor layer, and a second conductive layer on the second insulating film and including a barrier layer, which includes titanium, and a main conductive layer, which includes aluminum or an aluminum alloy, wherein the semiconductor layer includes an oxide semiconductor, and the barrier layer is between the semiconductor layer and the main conductive layer and overlaps the channel region of the transistor.

16 Claims, 16 Drawing Sheets

(51) Int. Cl.
*H01L 27/12* (2006.01)
*H01L 29/786* (2006.01)
*H10K 50/80* (2023.01)
*H10K 59/12* (2023.01)
*H10K 59/131* (2023.01)
*H10K 59/121* (2023.01)

(58) Field of Classification Search
CPC ........... H10K 59/1213; H10K 59/1201; H10K 59/1315; H10K 59/126
See application file for complete search history.

(56) References Cited

U.S. PATENT DOCUMENTS

| | | | | |
|---|---|---|---|---|
| 2004/0056251 | A1* | 3/2004 | Kim | H01L 29/458 257/E29.147 |
| 2005/0158925 | A1 | 7/2005 | Kim | |
| 2006/0043365 | A1* | 3/2006 | Kwak | G02F 1/136286 438/151 |
| 2007/0235777 | A1* | 10/2007 | Nagata | H01L 29/78606 257/E27.113 |
| 2010/0090217 | A1* | 4/2010 | Akimoto | H01L 29/45 257/E29.1 |
| 2014/0326994 | A1* | 11/2014 | Tanaka | H01L 29/78618 257/43 |
| 2017/0141169 | A1* | 5/2017 | Sim | H10K 59/1213 |
| 2017/0146834 | A1 | 5/2017 | Tak et al. | |
| 2017/0220163 | A1 | 8/2017 | Kurasawa et al. | |
| 2018/0069129 | A1 | 3/2018 | Lee et al. | |
| 2018/0120975 | A1 | 5/2018 | Kim et al. | |
| 2018/0122332 | A1 | 5/2018 | Ikeda et al. | |
| 2019/0027507 | A1* | 1/2019 | Toyotaka | H01L 27/124 |
| 2019/0378886 | A1* | 12/2019 | Jeong | H01L 29/7869 |
| 2020/0058723 | A1* | 2/2020 | Lee | H10K 59/123 |
| 2020/0099013 | A1 | 3/2020 | Wang et al. | |
| 2021/0019007 | A1 | 1/2021 | Park et al. | |
| 2021/0020110 | A1 | 1/2021 | Park et al. | |
| 2021/0036028 | A1 | 2/2021 | Kim et al. | |
| 2021/0036029 | A1 | 2/2021 | Park et al. | |
| 2021/0036076 | A1 | 2/2021 | Kim et al. | |
| 2021/0066421 | A1* | 3/2021 | Son | H10K 59/1201 |
| 2021/0159250 | A1 | 5/2021 | Chang et al. | |
| 2021/0265442 | A1 | 8/2021 | Cho et al. | |
| 2021/0320268 | A1* | 10/2021 | Kang | H10K 59/12 |

FOREIGN PATENT DOCUMENTS

| | | |
|---|---|---|
| KR | 10-2017-0078075 A | 7/2017 |
| KR | 10-2018-0099666 A | 9/2018 |

* cited by examiner

200: 210, 220, 230

DISPLAY DEVICE

CROSS-REFERENCE TO RELATED APPLICATIONS

This application is a continuation of U.S. patent application Ser. No. 17/223,984, filed Apr. 6, 2021, which claims priority to and the benefit of Korean Patent Application No. 10-2020-0087975, filed Jul. 16, 2020, the entire content of both of which is incorporated herein by reference.

BACKGROUND

1. Field

The present disclosure relates to a display device.

2. Description of the Related Art

Display devices are becoming more important with developments in multimedia technology. Accordingly, various display devices such as a liquid crystal display (LCD) device, an organic light-emitting diode (OLED) display device, and the like have been used.

A typical display device includes a plurality of pixels representing different colors (e.g., being able to display different colors) and can thus realize the display of colors. In order for the pixels to operate independently and display different colors, the display device may include driving signal lines for transmitting driving signals and various functional electrodes disposed in the pixels.

For example, there is a need for the driving signal lines to have low resistance, high thermal stability, and easy processability.

SUMMARY

Aspects of embodiments of the present disclosure are directed toward a display device capable of providing improved display quality by improving signal delays while realizing high resolution and toward a method of fabricating the display device.

However, aspects of embodiments of the present disclosure are not restricted or limited to those set forth herein. The above and other aspects of embodiments of the present disclosure will become more apparent to one of ordinary skill in the art to which the present disclosure pertains by referencing the detailed description of the present disclosure given below.

An embodiment of a display device includes a substrate, a corrosion prevention layer on the substrate and including (e.g., being) an inorganic material, a first conductive layer on the corrosion prevention layer and including (e.g., being) aluminum or an aluminum alloy, a first insulating film on the first conductive layer, a semiconductor layer on the first insulating film and including a channel region of a transistor, a second insulating film on the semiconductor layer, and a second conductive layer on the second insulating film and including a barrier layer, which includes (e.g., is) titanium, and a main conductive layer, which includes (e.g., is) aluminum or an aluminum alloy, wherein the semiconductor layer includes (e.g., is) an oxide semiconductor, and the barrier layer is between the semiconductor layer and the main conductive layer and overlaps with the channel region of the transistor.

An embodiment of a display device includes a substrate, a semiconductor layer on the substrate and including a channel region of a transistor, a first insulating film on the semiconductor layer, a first conductive layer on the first insulating film and including a barrier layer, which includes (e.g., is) titanium, a main conductive layer, which includes (e.g., is) aluminum or an aluminum alloy, and a capping layer, which includes (e.g., is) titanium, a second insulating film on the first conductive layer, and a second conductive layer on the second insulating film and including a source electrode and a drain electrode of the transistor, wherein the semiconductor layer includes (e.g., is) an oxide semiconductor, the first conductive layer includes a gate electrode of the transistor, and the barrier layer is between the semiconductor layer and the main conductive layer and overlaps the channel region of the transistor.

According to the aforementioned and other aspects of embodiments of the present disclosure, an improved display quality can be provided by improving signal delays while providing high resolution.

Other features and aspects of embodiments of the present disclosure may be apparent from the following detailed description, the drawings, and the claims.

BRIEF DESCRIPTION OF THE DRAWINGS

The above and other aspects and features of embodiments of the present disclosure will become more apparent by describing in more detail embodiments of the present disclosure with reference to the attached drawings, in which:

FIGS. 10 through 12A are cross-sectional views illustrating a method of fabricating a display device according to an embodiment of the present disclosure;

DETAILED DESCRIPTION

Figure 1:
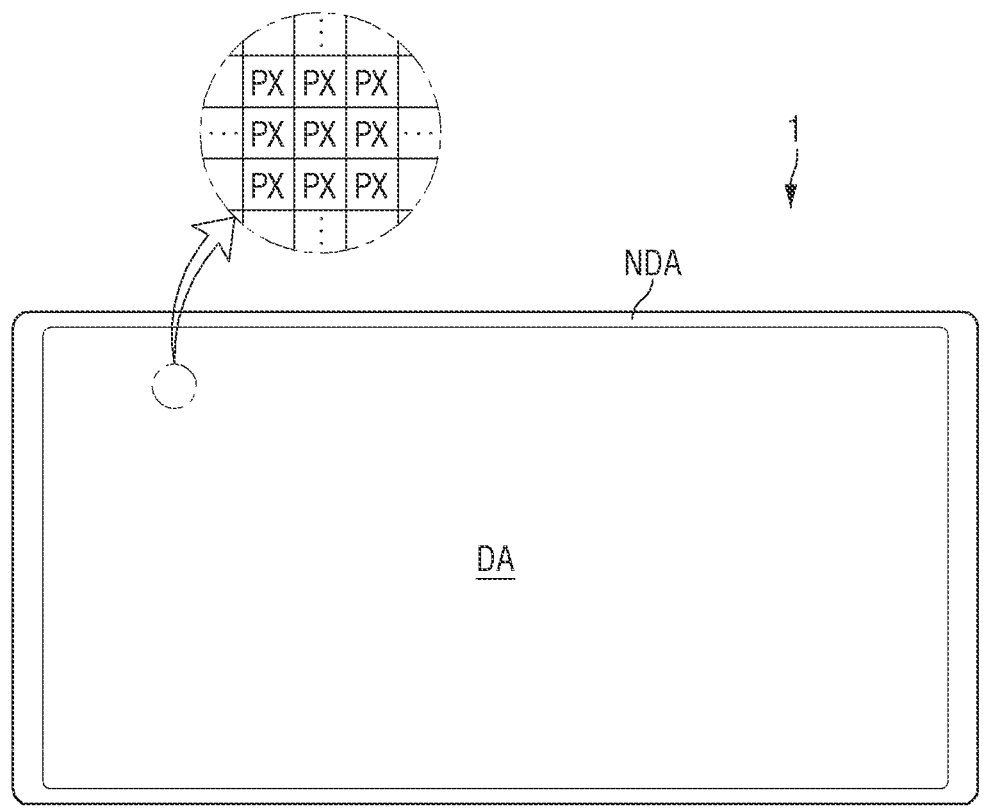
FIG. 1 is a plan view of a display device according to an embodiment of the present disclosure.
Figure 1:
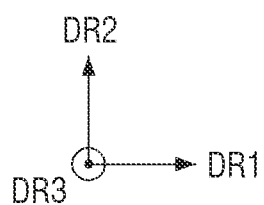

The present disclosure will now be described more fully hereinafter with reference to the accompanying drawings, in which some embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those of ordinary skill in the art. As used herein, the use of the term "may," when describing embodiments of the present disclosure, refers to "one or more embodiments of the present disclosure."

It will also be understood that when a layer is referred to as being "on" another layer or substrate, it can be directly on the other layer or substrate, or intervening layers may also be present. The same reference numbers indicate the same components throughout the specification. In the attached drawings, the thickness of layers and regions may be exaggerated for clarity. As used herein, the term "and/or" includes any and all combinations of one or more of the associated listed items.

Although the terms "first," "second," etc. may be used herein to describe various elements, these elements, should not be limited by these terms. These terms may be used to distinguish one element from another element. Thus, a first element discussed below may be termed a second element without departing from the teachings of the present disclosure. The description of an element as a "first" element may not require or imply the presence of a second element or other elements. The terms "first," "second," etc. may also be used herein to differentiate different categories or sets of elements. For conciseness, the terms "first", "second", etc. may represent "first-category (or first-set)," "second-category (or second-set)," etc., respectively. As used herein, the term "substantially," "about," "approximately," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Embodiments of the present disclosure will hereinafter be described with reference to the accompanying drawings.

Figure 2:
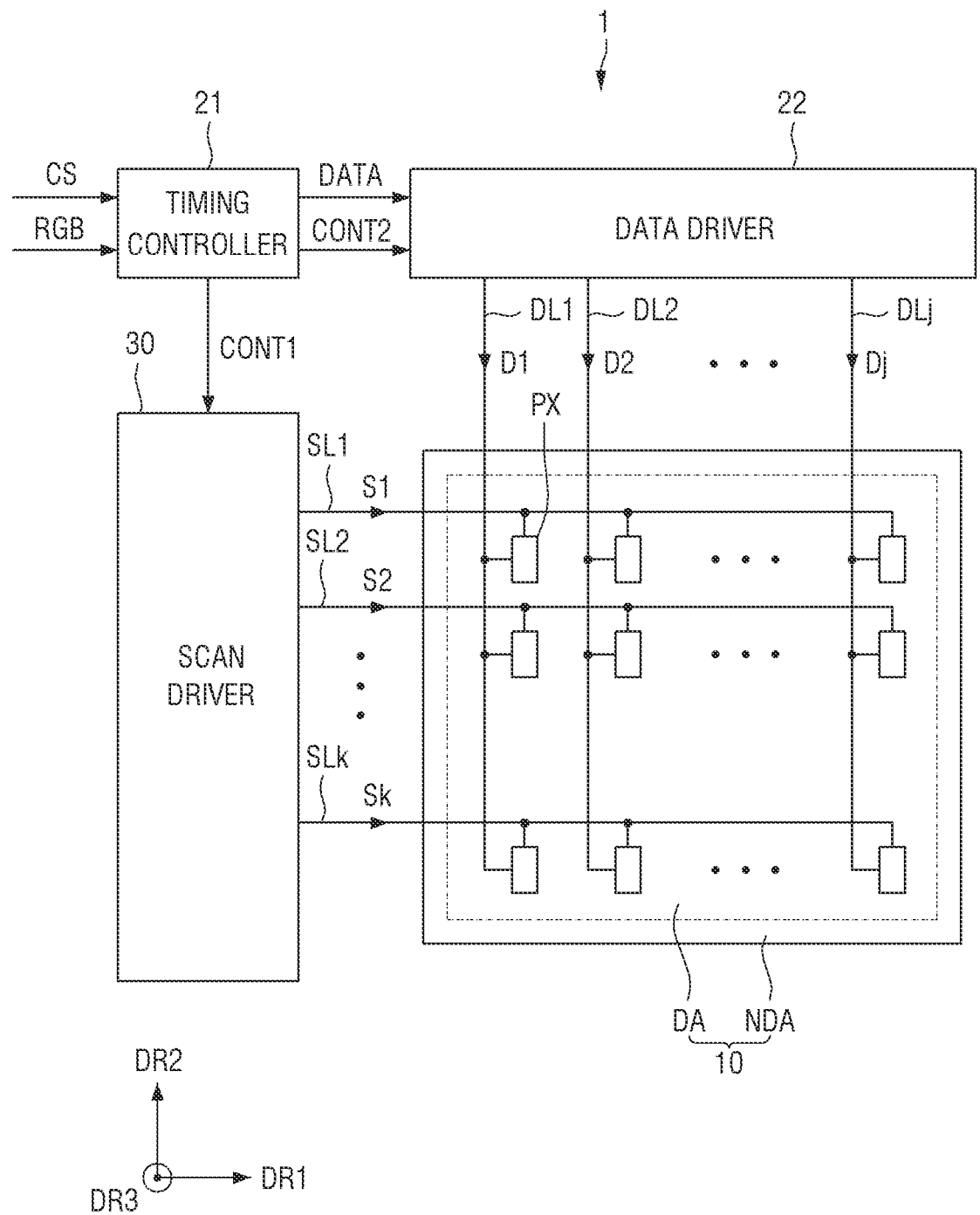
FIG. 2 is a block diagram of the display device of FIG. 1.

FIG. 1 is a plan view of a display device according to an embodiment of the present disclosure. FIG. 2 is a block diagram of the display device of FIG. 1.

Referring to FIGS. 1 and 2, a display device 1, which is a device for displaying a moving or still image, may be utilized (e.g., used) not only as the display screens of portable electronic devices such as, for example, a mobile phone, a smartphone, a tablet personal computer (PC), a smartwatch, a watchphone, a mobile communication terminal, an electronic notepad, an electronic book, a portable multimedia player (PMP), a navigation system, and an ultra-mobile PC (UMPC), but may also be utilized (e.g., used) as the display screens of various other suitable products such as a television (TV), a notebook computer, a monitor, a billboard, and an Internet-of-things (IoT) device.

The display device 1 may have a substantially rectangular shape in a plan view. The display device 1 may have a rectangular shape with right-angled corners in a plan view, but the present disclosure is not limited thereto. In some embodiments, the display device 1 may have a rectangular shape with rounded corners in a plan view.

Referring to FIGS. 1 and 2, a first direction DR1 refers to a horizontal direction of the display device 1 in a plan view, a second direction DR2 refers to a vertical direction of the display device 1 in a plan view, and a third direction DR3 refers to the thickness direction of the display device 1. The first and second directions DR1 and DR2 may perpendicularly intersect or cross each other, and the third direction DR3, which is a direction that intersects or crosses the plane where the first and second directions DR1 and DR2 reside, may perpendicularly intersect or cross both the first and second directions DR1 and DR2. However, the first, second, and third directions DR1, DR2, and DR3 are relative directions and are thus not particularly limited.

Unless specified otherwise, the terms "above," "top surface," and "upper," as used herein, may refer to the side of the display surface of the display device 1 (e.g., the side of the display device 1 that is to display an image), and the terms "below," "bottom surface," and "lower" may refer to the opposite side to the side of the display surface of the display device 1.

The display device 1 may include a display panel 10, a timing controller 21, a data driver 22, and a scan driver 30.

The display panel 10 may be an organic light-emitting diode (OLED) display panel. The display panel 10 will hereinafter be described as being, for example, an OLED display panel, but the present disclosure is not limited thereto. That is, various other suitable display panels such as a liquid crystal display (LCD) panel, a quantum-dot OLED display panel, a quantum-dot LCD panel, a quantum nano-light-emitting diode (QNED), a micro-light-emitting diode (micro-LED) display panel, and the like may be utilized (e.g., used) as the display panel 10.

The display panel 10 may include a display area DA, which displays a screen, and a non-display area NDA, which does not display a screen. The display panel 10 may be divided into the display area DA and the non-display area NDA in a plan view. The non-display area NDA may be disposed to surround (e.g., partially or entirely surround) the display area DA. The non-display area NDA may form a bezel of the display panel 10.

The display area DA may have a rectangular shape with right-angled or rounded corners in a plan view. However, the planar shape of the display area DA is not particularly limited. That is, the display area DA may have various other suitable shapes such as a circular or elliptical shape in a plan view.

The display area DA may include a plurality of pixels PX. The pixels PX may be arranged in a matrix. Each of the pixels PX may include a light-emitting layer and a circuit layer for controlling the amount of light emitted by the light-emitting layer. The circuit layer may include wires, electrodes, and at least one transistor. The light-emitting layer may include (e.g., be) an organic light-emitting material. The light-emitting layer may be sealed by an encapsulation film. The structure of the pixels PX will be described later in more detail.

The non-display area NDA may be disposed adjacent to both short sides and both long sides of the display area DA.

In this case, the non-display area NDA may surround all the sides of the display area DA to form the edges of the display area DA. However, the present disclosure is not limited to this. In some embodiments, the non-display area NDA may be disposed adjacent to only both short sides or both long sides of the display area DA.

A plurality of scan lines SL1 through SLk (where k is an integer of 2 or greater), a plurality of data lines DL1 through DLj (where j is an integer of 2 or greater), and a plurality of power supply lines, which are all coupled (e.g., connected) to the pixels PX, may be disposed in the display area DA. The scan lines SL1 through SLk may extend in the first direction DR1 and may be arranged with each other along the second direction DR2. The data lines DL1 through DLj may extend in the second direction DR2 and may be arranged with each other along the first direction DR1.

The display panel 10 may include a plurality of pixels PX, which are respectively disposed at the intersections or crossings between the scan lines SL1 through SLk and the data lines DL1 through DLj and are thus arranged in a matrix. Each of the pixels PX may be coupled (e.g., connected) to at least one of the scan lines SL1 through SLk and one of the data lines DL1 through DLj.

The timing controller 21 receives digital video data RGB and timing signals CS from a host system. In some embodiments, the timing controller 21 may receive (e.g., from the host system) the digital video data RGB and may generate and/or transmit digital video data DATA to the data driver 22. The host system may be an application processor of a smartphone or a tablet personal computer (PC) or a system-on-chip of a monitor or a TV.

The timing controller 21 may generate control signals for controlling the operation timings of the data driver 22 and the scan driver 30. In some embodiments, the timing controller 21 may receive (e.g., from the host system) the timing signals CS. The control signals may include a source control signal CONT2, which is for controlling the operation timing of the data driver 22, and a scan control signal CONT1, which is for controlling the operation timing of the scan driver 30.

The scan driver 30 receives the scan control signal CONT1 from the timing controller 21. The scan driver 30 may generate scan signals 51 through Sk (where k is an integer of 2 or greater) in accordance with the scan control signal CONT1 and may provide the scan signals 51 through Sk to the scan lines SL1 through SLk of the display panel 10. The scan driver 30 may be formed in the non-display area NDA of the display panel 10. The scan driver 30 may be formed as an integrated circuit (IC).

The data driver 22 receives the digital video data DATA and the source control signal CONT2 from the timing controller 21. The data driver 22 may convert the digital video data DATA into analog data voltages and provide the analog data voltages to the data lines DL1 through DLj in accordance with the source control signal CONT2. The pixels PX may emit light of a particular luminance based on driving currents provided to light-emitting elements in accordance with data signals D1 through Dj (where j is an integer of 2 or greater) provided thereto via the data lines DL1 through DLj.

A power supply circuit may generate voltages for driving the display panel 10 from a main power source and may provide the generated voltages to the display panel 10. For example, the power supply circuit may generate first and second power supply voltages ELVDD and ELVSS (see FIG. 3), which are for driving light-emitting elements "OLED" of the display panel 10, from the main power source and may provide the first and second power supply voltages ELVDD and ELVSS to first and second power supply voltage lines ELVDL and ELVSL (see FIG. 3) of the display panel 10. Also, the power supply circuit may generate driving voltages for driving the timing controller 21, the data driver 22, and the scan driver 30 from the main power source. The power supply circuit may be formed as an integrated circuit (IC) and may be mounted on a circuit board, but the present disclosure is not limited thereto.

Figure 3:
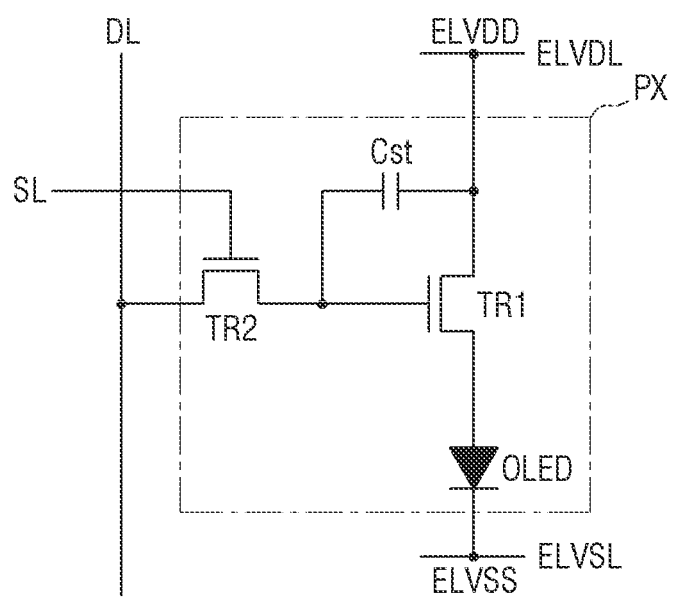
FIG. 3 is an equivalent circuit diagram of a pixel of the display device of FIG. 1.

FIG. 3 is an equivalent circuit diagram of a pixel of the display device of FIG. 1.

Referring to FIG. 3, a pixel PX may include a first transistor TR1, a second transistor TR2, a light-emitting element "OLED", and a capacitor Cst. FIG. 3 illustrates that the pixel PX has a "2 transistors-1 capacitor" (2T1C) structure including two transistors and one capacitor, but the present disclosure is not limited thereto. In some embodiments, the pixel PX may include more than two transistors and more than one capacitor. That is, various other suitable structures (such as, for example, a 3T1C structure, a 6T1C structure, a 7T1C structure, and/or a 5T2C structure) may also be applicable to the pixel PX.

Each of the first and second transistors TR1 and TR2 may include a first source/drain electrode (e.g., a source electrode or a drain electrode), a second source/drain electrode (e.g., a drain electrode or a source electrode), and a gate electrode. One of the first and second source/drain electrodes may be a source electrode, and the other one of the first and second source/drain electrodes may be a drain electrode.

The first and second transistors TR1 and TR2 may be formed as thin-film transistors (TFTs). FIG. 3 illustrates that the first and second transistors TR1 and TR2 may be N-type metal oxide semiconductor field-effect transistors (MOSFETs), but the present disclosure is not limited thereto. For example, the first and second transistors TR1 and TR2 may be formed as P-type MOSFETs. In this case, the locations of the source and drain electrodes of each of the first and second transistors TR1 and TR2 may be reversed. The first and second transistors TR1 and TR2 will hereinafter be described as being, for example, N-type MOSFETs.

The first transistor TR1 may be a driving transistor. For example, a gate electrode of the first transistor TR1 may be coupled (e.g., connected) to both the second source/drain electrode of the second transistor TR2 and to a second electrode of the capacitor Cst. The first source/drain electrode of the first transistor TR1 may be coupled (e.g., connected) to the first power supply line ELVDL. The second source/drain electrode of the first transistor TR1 may be coupled (e.g., connected) to the anode electrode of the light-emitting element "OLED". The first transistor TR1 may receive a data signal Dm (where m is an integer of 1 or greater) and provide a driving current to the light-emitting element "OLED" in accordance with the switching operation of the second transistor TR2.

A gate electrode of the second transistor TR2 may be coupled (e.g., connected) to a scan line SL. The first source/drain electrode of the second transistor TR2 may be coupled (e.g., connected) to a data line DL. The second source/drain electrode of the second transistor TR2 may be coupled (e.g., connected) to the gate electrode of the first transistor TR1 and to the second electrode of the capacitor Cst. The second transistor TR2 may be turned on by a scan signal Sn (where n is an integer of 1 or greater) to perform a switching operation that transmits the data signal Dm to the gate electrode of the first transistor TR1.

A first electrode of the capacitor Cst may be coupled (e.g., connected) to the first power supply line ELVDL and to the first source/drain electrode of the first transistor TR1, and the second electrode of the capacitor Cst may be coupled (e.g., connected) to the gate electrode of the first transistor TR1 and to the second source/drain electrode of the second transistor TR2. The capacitor Cst may uniformly maintain the data voltage applied to the gate electrode of the first transistor TR1.

The light-emitting element "OLED" may emit light in accordance with the driving current from the first transistor TR1. The light-emitting element "OLED" may be an OLED including an anode electrode (or a first electrode), an organic light-emitting layer, and a cathode electrode (or a second electrode). The anode electrode of the light-emitting element "OLED" may be coupled (e.g., connected) to the second source/drain electrode of the first transistor TR1, and the cathode electrode of the light-emitting element "OLED" may be coupled (e.g., connected) to the second power supply line ELVSL, to which a power supply voltage lower than the first power supply voltage ELVDD (e.g., the second power supply voltage ELVSS) is applied.

The cross-sectional structure of the pixel PX will hereinafter be described.

Figure 4:
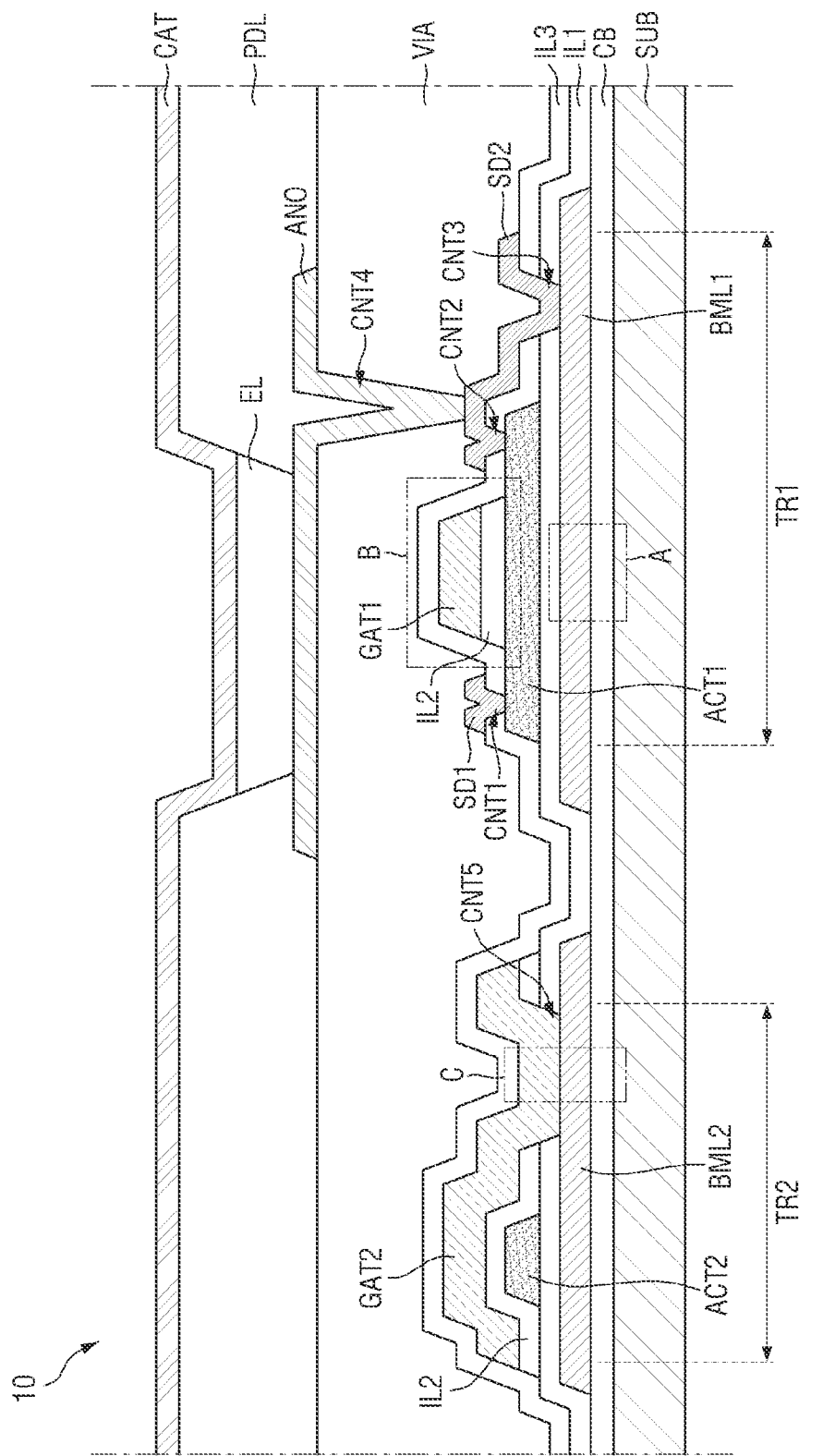
FIG. 4 is a cross-sectional view of a display panel according to an embodiment of the present disclosure.

FIG. 4 is a cross-sectional view of a display panel according to an embodiment of the present disclosure. FIG. 4 illustrates an example cross-sectional view of the first and second transistors TR1 and TR2 of FIG. 3.

Referring to FIG. 4, the display panel 10 includes a semiconductor layer SCL, a plurality of conductive layers, and a plurality of insulating layers, which are all disposed on a base substrate SUB. The conductive layers may include a first conductive layer 100, a second conductive layer 200, a third conductive layer 300, and an anode electrode ANO. The insulating layers may include a corrosion prevention layer CB, a first insulating film IL1, a second insulating film IL2, a third insulating film IL3, and a via layer VIA. The corrosion prevention layer CB, the first conductive layer 100, the first insulating film IL1, the semiconductor layer SCL, the second conductive layer 200, the third insulating film IL3, the third conductive layer 300, the via layer VIA, the anode electrode ANO, and a pixel-defining film PDL may be sequentially arranged on the base substrate SUB. One or more of the corrosion prevention layer CB, the first conductive layer 100, the first insulating film IL1, the semiconductor layer SCL, the second conductive layer 200, the third insulating film IL3, the third conductive layer 300, the via layer VIA, the anode electrode ANO, and the pixel-defining film PDL may be formed as single-layer films or as stacks of multiple films. Other layers may be further disposed between respective ones of the corrosion prevention layer CB, the first conductive layer 100, the first insulating film IL1, the semiconductor layer SCL, the second conductive layer 200, the third insulating film IL3, the third conductive layer 300, the via layer VIA, the anode electrode ANO, and the pixel-defining film PDL. The base substrate SUB supports the layers disposed thereabove. The base substrate SUB may be generally (e.g., suitably) transparent and may have a suitably high light transmittance. The base substrate SUB may include (e.g., be) an inorganic material such as glass and/or quartz. For example, the inorganic material may include (e.g., be) silicon dioxide ($SiO_2$), but the present disclosure is not limited thereto. The base substrate SUB may be a transparent plate or film, but the present disclosure is not limited thereto.

The base substrate SUB may be a suitably rigid substrate, but the present disclosure is not limited thereto. In some embodiments, the base substrate SUB may be a suitably flexible substrate that is bendable, foldable, and/or rollable.

The base substrate SUB may be an ultra-thin glass (UTG) substrate having a thickness of 0.1 mm or less. As used herein, the term mm may mean a distance equal to $10^{-3}$ meters. In this case, the thickness and the weight of the display device 1 can be generally reduced, and as a result, a user's convenience can be maximized or improved.

The corrosion prevention layer CB may be disposed on the base substrate SUB. The corrosion prevention layer CB may prevent or block the diffusion of impurity ions and/or the penetration of moisture and/or external air. As will be described later, the corrosion prevention layer CB may prevent, reduce, or suppress the corrosion of the first conductive layer 100, even when the first conductive layer 100, which is disposed on the corrosion prevention layer CB, includes (e.g., is) aluminum (Al) or an Al alloy, and as a result, the display panel 10 can be smoothly driven. That is, if a main conductive layer 110 (see FIG. 5) including (e.g., being) Al is in direct contact with the base substrate SUB, moisture and/or external air may diffuse into the base substrate SUB or into the main conductive layer 110 through the base substrate SUB and may then react with the Al of the main conductive layer 110, and as a result, the main conductive layer 110 may be oxidized and/or corroded, even though the base substrate SUB includes (e.g., is) glass and/or quartz. If the main conductive layer 110 is oxidized and/or corroded, the resistance of the main conductive layer 110 may increase, and as a result, the resistance of the first conductive layer 100 may increase.

Thus, the diffusion of moisture and/or external air into the main conductive layer 110 can be suppressed, reduced, or prevented by arranging the corrosion prevention layer CB between the base substrate SUB and the main conductive layer 110. Accordingly, the resistance of the first conductive layer 100 can be maintained to be low, and the display quality and the reliability of the display device 1 can be improved. For example, an increase in the resistance of the first conductive layer 100 may be prevented, reduced, or suppressed. The corrosion prevention layer CB may have a thickness tCB of, for example, 1000 Å to 2000 Å or 500 Å to 3000 Å, but the present disclosure is not limited thereto. As used herein, the term Å may mean a distance equal to $10^{-10}$ meters.

The corrosion prevention layer CB may include (e.g., be) an inorganic material. For example, the corrosion prevention layer CB may include (e.g., be) silicon nitride, silicon oxide, and/or silicon oxynitride, but the present disclosure is not limited thereto.

The first conductive layer 100 is disposed on the corrosion prevention layer CB. The first conductive layer 100 may be disposed below the semiconductor layer SCL and may perform the functions of a light-blocking pattern and a lower conductive layer for the semiconductor layer SCL.

The first conductive layer 100 may include a first lower conductive pattern BML1 and a second lower conductive pattern BML2. The first and second lower conductive patterns BML1 and BML2 may prevent or block light incident from below the display panel 10 from entering semiconductor patterns ACT1 and ACT2, which are the active layers of the first and second transistors TR1 and TR2 and are disposed above the first and second lower conductive patterns BML1 and BML2. For example, the first and second lower conductive patterns BML1 and BML2 may respectively prevent or block light incident from below the display panel 10 from entering channel regions of the semiconductor patterns ACT1 and ACT2.

In some embodiments, the first lower conductive pattern BML1 may be disposed to cover at least the channel region of the semiconductor pattern ACT1 of the first transistor TR1, and the second lower conductive pattern BML2 may be disposed to cover at least the channel region of the semiconductor pattern ACT2 of the second transistor TR2. In some embodiments, the first lower conductive pattern BML1 may be disposed to cover the entire semiconductor pattern ACT1 of the first transistor TR1, and the second lower conductive pattern BML2 may be disposed to cover the entire semiconductor pattern ACT2 of the second transistor TR2.

The first and second lower conductive patterns BML1 and BML2 may be disposed below the semiconductor layer SCL and may perform as (e.g., may be or may function as) lower conductive layers for the semiconductor layer SCL. In some embodiments, the first lower conductive pattern BML1 may be electrically coupled (e.g., electrically connected) to a second source/drain electrode SD2 of the first transistor TR1. Also, the second lower conductive pattern BML2 may be electrically coupled (e.g., electrically connected) to a gate electrode GAT2 of the second transistor TR2. Accordingly, the device characteristics of the first transistor TR1, which is a driving transistor, and the device characteristics of the second transistor TR2, which is a switching transistor, can be improved. For example, the first transistor TR1, which is a driving transistor, can easily control a driving current, and the second transistor TR2, which is a switching transistor, can be easily turned on or off.

The first conductive layer 100 may include not only the first and second lower conductive patterns BML1 and BML2, but may also include a first power supply wire corresponding to the first power supply line ELVDL of FIG. 3, a data wire corresponding to the data line DL of FIG. 3, and the first electrode of the capacitor Cst of FIG. 3.

The first conductive layer 100 may include (e.g., be) Al. Because Al has a lower resistance than molybdenum (Mo), a conductive layer including (e.g., being) Al or an Al alloy can be sufficiently conductive even at a small thickness, as compared to a conductive layer including (e.g., being) Mo or the like.

The stack structure of the first conductive layer 100 will hereinafter be described.

The first insulating film IL1 is disposed on the first conductive layer 100. The first insulating film IL1 covers the first conductive layer 100 and may be disposed on the entire surface of the corrosion prevention layer CB. The first insulating film IL1 may include contact holes, for example, contact holes corresponding to contact holes CNT3 and CNT5. The first insulating film IL1 may perform the functions of an interlayer insulating film that insulates the first conductive layer 100 and the semiconductor layer SCL. The first insulating film IL1 may include (e.g., be) at least one of silicon nitride, silicon oxide, or silicon oxynitride.

The semiconductor layer SCL may be disposed on the first insulating film IL1. The semiconductor layer SCL may include the semiconductor patterns ACT1 and ACT2 of the first and second transistors TR1 and TR2. The semiconductor pattern ACT1 of the first transistor TR1 may be the active layer of the first transistor TR1, and the semiconductor pattern ACT2 of the second transistor TR2 may be the active layer of the second transistor TR2. The semiconductor patterns ACT1 and ACT2 of the first and second transistors TR1 and TR2 may be disposed in each pixel PX.

The semiconductor pattern ACT1 of the first transistor TR1 may include the channel region of the first transistor TR1, which is disposed to overlap with the gate electrode GAT1 of the first transistor TR1 in the thickness direction (e.g., in the plan view), and may also include first and second source/drain regions of the first transistor TR1, which are disposed on both sides of the channel region of the first transistor TR1. The first and second source/drain regions of the first transistor TR1 may be conductor regions and may be more conductive, but lower in resistance, than the channel region of the first transistor TR1.

The semiconductor pattern ACT2 of the second transistor TR2 may include the channel region of the second transistor TR2, which is disposed to overlap with the gate electrode GAT2 of the second transistor TR2 in the thickness direction (e.g., in the plan view), and may also include first and second source/drain regions of the second transistor TR2, which are disposed on both sides of the channel region of the second transistor TR2. The first and second source/drain regions of the second transistor TR2 may be conductor regions and may be more conductive, but lower in resistance, than the channel region of the second transistor TR2.

The semiconductor layer SCL may include (e.g., be) an oxide semiconductor. The oxide semiconductor may include (e.g., be), for example, a binary compound $AB_x$, a ternary compound $AB_xC_y$, a quaternary compound $AB_xC_yD_z$, or a quinary compound $AB_xC_yD_zE_w$ containing indium (In), zinc (Zn), gallium (Ga), tin (Sn), titanium (Ti), Al, hafnium (Hf), zirconium (Zr), and/or magnesium (Mg). For example, the semiconductor layer SCL may include (e.g., be) indium-gallium-zinc oxide (IGZO) or indium-tin-gallium-zinc oxide (ITGZO).

The second insulating film IL2 may be disposed on the semiconductor layer SCL. The second insulating film IL2 may be disposed only on parts of the semiconductor layer SCL. In some embodiments, the second insulating film IL2 may overlap with parts of the semiconductor flayer SCL. The second insulating film IL2 may cover the channel region of the first transistor TR1 and may expose the first and second source/drain regions of the first transistor TR1 and side surfaces of the semiconductor layer SCL.

The second insulating film IL2 may have substantially the same planar shape as the second conductive layer 200, which is disposed on the second insulating film IL2. Side surfaces of the second insulating film IL2 may be aligned with side surfaces of the second conductive layer 200. In some embodiments, the second insulating film IL2 may include contact holes, for example, contact holes corresponding to the contact hole CNT5.

The second insulating film IL2 may include (e.g., be) a silicon compound and/or a metal oxide. For example, the second insulating film IL2 may include (e.g., be) silicon oxide, silicon nitride, silicon oxynitride, aluminum oxide, tantalum oxide, hafnium oxide, zirconium oxide, or titanium oxide. These materials may be utilized (e.g., used) alone or in combination with one another.

The second conductive layer 200 is disposed on the second insulating film IL2. The second conductive layer 200 may include the gate electrodes GAT1 and GAT2 of the first and second transistors TR1 and TR2. The gate electrode GAT1 of the first transistor TR1 may be electrically coupled (e.g., electrically connected) to the source electrode of the second transistor TR2. The second conductive layer 200 may further include the second (or the upper electrode) of the capacitor Cst (of FIG. 3). The second conductive layer 200 may be formed of Al. In some embodiments, the second conductive layer 200 may include (e.g., be) Al.

The gate electrode GAT2 of the second transistor TR2 may be electrically coupled (e.g., electrically connected) to the second lower conductive pattern BML2 through the contact hole CNT5, which exposes part of the second lower conductive pattern BML2.

The stack structure of the second conductive layer 200 will be described later.

The third insulating film IL3 may be disposed on the second conductive layer 200. The third insulating film IL3 may cover the second conductive layer 200, the second insulating film IL2, and the semiconductor layer SCL and may be disposed on the entire surface of the first insulating film IL1. In some embodiments, the third insulating film IL3 may include contact holes, for example, contact holes corresponding to contact holes CNT1, CNT2, and CNT3. The third insulating film IL3 may perform the functions of an interlayer insulating film that insulates the second conductive layer 200 and the third conductive layer 300. The second insulating film IL2 may include (e.g., be) at least one of silicon nitride, silicon oxide, or silicon oxynitride. In some embodiments, the third insulating film IL3 may include (e.g., be) at least one of silicon nitride, silicon oxide, or silicon oxynitride.

The third conductive layer 300 may be disposed on the third insulating film IL3. The third conductive layer 300 may include first and second source/drain electrodes SD1 and SD2 of the first transistor TR1. The third conductive layer 300 may include source and drain electrodes of the second transistor TR2.

The third conductive layer 300 may further include the first power supply wire corresponding to the first power supply line ELVDL of FIG. 3, the data wire corresponding to the data line DL of FIG. 3, and the second electrode of the capacitor Cst of FIG. 3.

The first source/drain electrode SD1 of the first transistor TR1 may be electrically coupled (e.g., electrically connected) to the first source/drain region of the first transistor TR1 through the contact hole CNT1, which exposes the first source/drain region of the first transistor TR1.

The second source/drain electrode SD2 of the first transistor TR1 may be electrically coupled (e.g., electrically connected) to the second source/drain region of the first transistor TR1 through the contact hole CNT2, which exposes the second source/drain region of the first transistor TR1. Also, the second source/drain electrode SD2 of the first transistor TR1 may be electrically coupled (e.g., electrically connected) to the first lower conductive pattern BML1 through the contact hole CNT3, which exposes part of the first lower conductive pattern BML1.

The third conductive layer 300 may be formed of a low-resistance material. The third conductive layer 300 may include (e.g., be) at least one metal selected from among Al, molybdenum (Mo), platinum (Pt), palladium (Pd), silver (Ag), magnesium (Mg), gold (Au), nickel (Ni), neodymium (Nd), iridium (Ir), chromium (Cr), Calcium (Ca), titanium (Ti), tantalum (Ta), tungsten (W), and copper (Cu), but the present disclosure is not limited thereto. The third conductive layer 300 may have the same stack structure as one of the first and second conductive layers 100 and 200.

The via layer VIA is disposed on the third conductive layer 300. The via layer VIA may be disposed on the third conductive layer 300 to completely cover the top surface of the third conductive layer 300. In some embodiments, the via layer VIA may include or have contact holes, for example, a fourth contact hole CNT4. In a case where the via layer VIA is formed as an organic film, the top surface of the via layer VIA may be generally flat (e.g., substantially flat) regardless of the presence of height differences (e.g., thickness differences) therebelow.

The via layer VIA may include (e.g., be) an inorganic insulating material and/or an organic insulating material such as an acrylic resin, an epoxy resin, a phenolic resin, a polyamide resin, a polyimide resin, an unsaturated polyester resin, a polyphenylene resin, a polyphenylene sulfide resin, and/or benzocyclobutene (BCB). The via layer VIA may further include (e.g., be) a photosensitive material, but the present disclosure is not limited thereto.

The anode electrode ANO is disposed on the via layer VIA. The anode electrode ANO may be disposed to be separated between different pixels PX. The anode electrode ANO may penetrate the via layer VIA and may be electrically coupled (e.g., electrically connected) to the second source/drain electrode SD2 of the first transistor TR1 via the contact hole CNT4. In some embodiments, the anode electrode ANO is disposed in the display area DA, but is not in the non-display area NDA.

The anode electrode ANO may have a structure in which a high-work-function material layer of indium-tin oxide (ITO), indium-zinc oxide (IZO), zinc oxide (ZnO), or indium oxide ($In_xO_y$) and a reflective material layer of Ag, Mg, Al, Pt, Pd, Au, Ni, Nd, Ir, Cr, Li, Ca, or a mixture thereof are stacked, but the present disclosure is not limited thereto. The high-work-function material layer may be disposed on the reflective material layer and may thus be located closer to an emission layer EL than the reflective material layer is to the emission layer EL. The anode electrode ANO may have a multilayer structure of one of ITO/Mg, ITO/MgF, ITO/Ag, or ITO/Ag/ITO, but the present disclosure is not limited thereto.

The pixel-defining film PDL may be disposed on the anode electrode ANO. For example, the pixel-defining film PDL may cover sides (e.g., edges) of the anode electrode ANO. The pixel-defining film PDL may include an opening that partially exposes the anode electrode ANO (e.g., a center portion of the anode electrode ANO). The pixel-defining film PDL may be formed of an organic insulating material and/or an inorganic insulating material. For example, the pixel-defining film PDL may include (e.g., be) at least one of a polyimide resin, an acrylic resin, a silicon compound, or a polyacrylic resin.

The emission layer EL and a cathode electrode CAT may be further disposed on part of the anode electrode ANO exposed by the pixel-defining film PDL.

The emission layer EL may include (e.g., be) an organic material layer. The organic material layer of the emission layer EL may include an organic light-emitting layer and may further include a hole injection/transport layer and/or an electron injection/transport layer. In some embodiments, the organic material layer of the emission layer EL may include the organic light-emitting layer and may further include at least one selected from among a hole injection layer, a hole transport layer, an electron injection layer, and an electron transport layer.

The cathode electrode CAT may be disposed on the emission layer EL. The cathode electrode CAT may be a common electrode disposed on the entire surface of the substrate SUB without regard to the distinction of each pixel PX. For example, the cathode electrode may be common to multiple pixels PX. The anode electrode ANO, the emission layer EL, and the cathode electrode CAT may form an organic light-emitting element "OLED".

The cathode electrode CAT may include a low-work-function material layer of Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg). The cathode electrode CAT may further include a transparent metal oxide layer, which is disposed on the low-work-function material layer.

A thin film encapsulation layer may be further disposed on the cathode electrode CAT. The thin-film encapsulation layer may include a plurality of insulating films, and the plurality of insulating films may include inorganic and/or organic insulating films.

The display device 1 may have as high a resolution of 460 ppi or greater. The timing controller 21 of the display device 1 may output a gate control signal at a frequency of 120 Hz to 240 Hz. The higher the frequency of outputting the gate control signal and/or the resolution of the display device 1, the shorter the gate-on duration of TFTs. When the resistance of scan signal lines is high, scan signal delays may occur, in which case, a sufficient gate-on duration cannot be secured so that horizontal striped patterns or display smudges may be generated.

In a case where the first and second conductive layers 100 and 200 are formed as conductive patterns that include (e.g., are) Al or an Al alloy, scan signal delays can be reduced, as compared to the case of utilizing (e.g., using) a material with a relatively high sheet resistance such as, for example, Mo, because the sheet resistance of Al or an Al alloy is relatively low. Accordingly, defects such as horizontal striped patterns or display smudges can be reduced.

Figure 6:
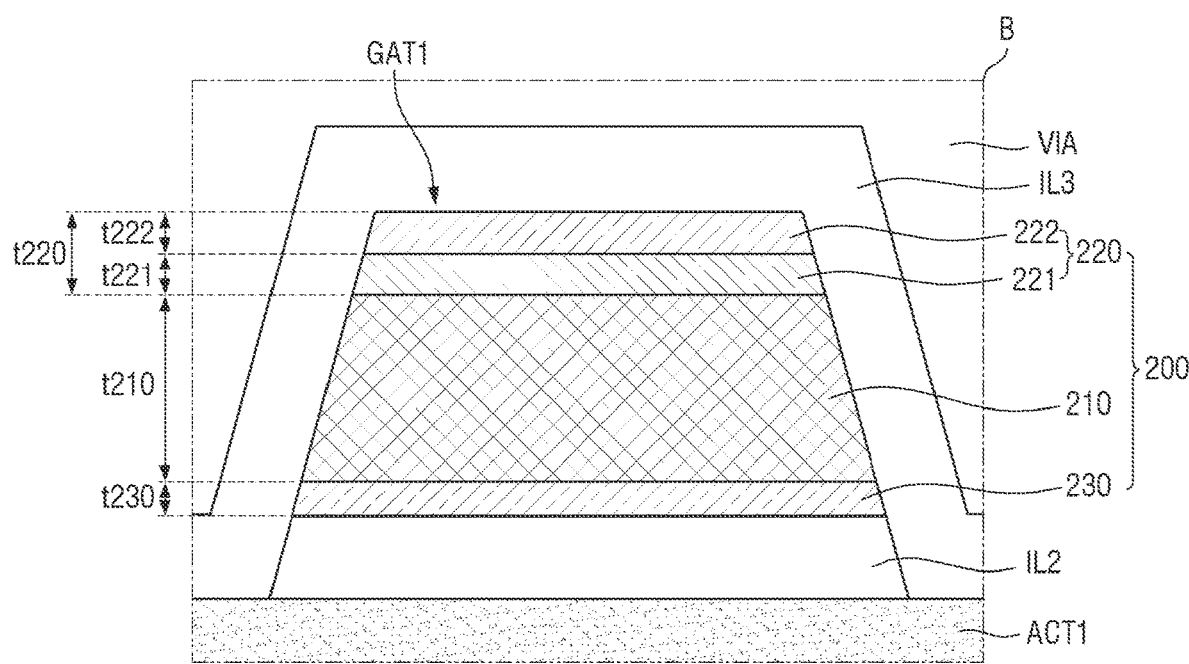
FIG. 6 is an enlarged cross-sectional view of an area B of FIG. 4.

As the first and second conductive layers 100 and 200 include Al or an Al alloy, the corrosion prevention layer CB, which is capable of reducing or preventing the corrosion of Al or an Al alloy, and a barrier layer 230 of FIG. 6, which is capable of preventing the lower part of a main conductive layer 210 of the second conductive layer 200 from being exposed (or reducing the exposure of the lower part of the main conductive layer 210 of the second conductive layer 200) and preventing or blocking the diffusion of hydrogen (H) into the channel regions of TFTs, can be further disposed.

The stack structures of the first and second conductive layers 100 and 200 and the contact relationship between the first and second conductive layers 100 and 200 will hereinafter be described with reference to FIGS. 5 through 7.

Figure 5:
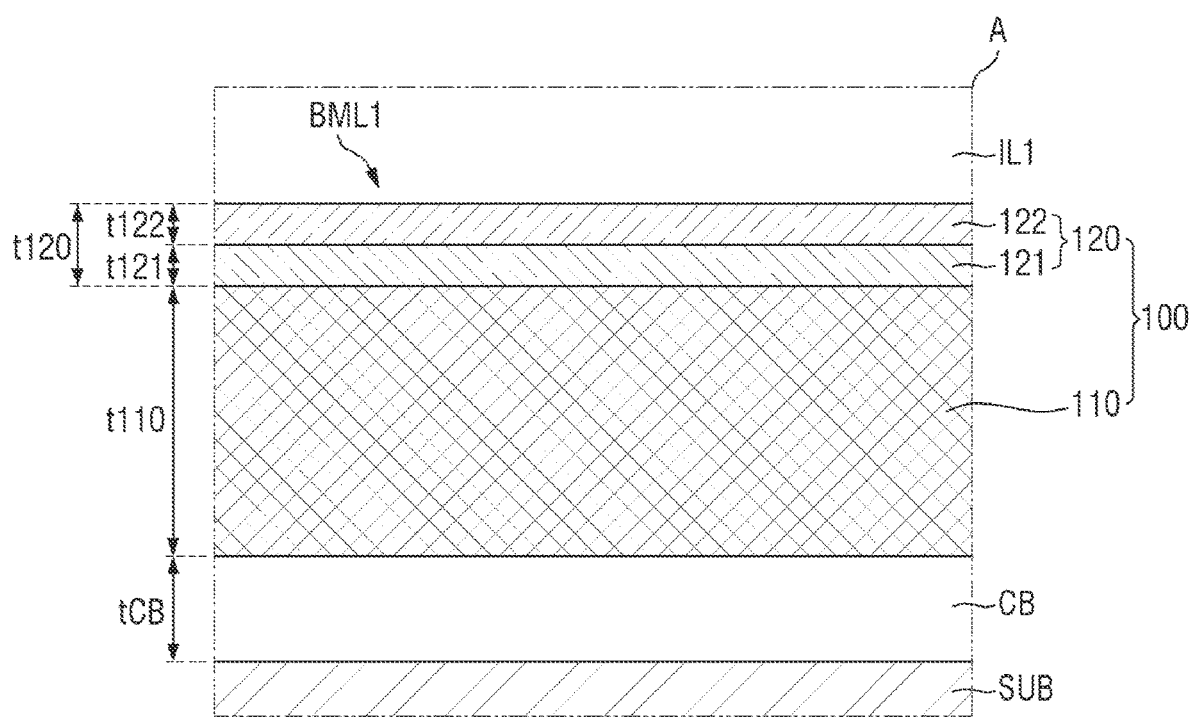
FIG. 5 is an enlarged cross-sectional view of an area A of FIG. 4.
Figure 7:
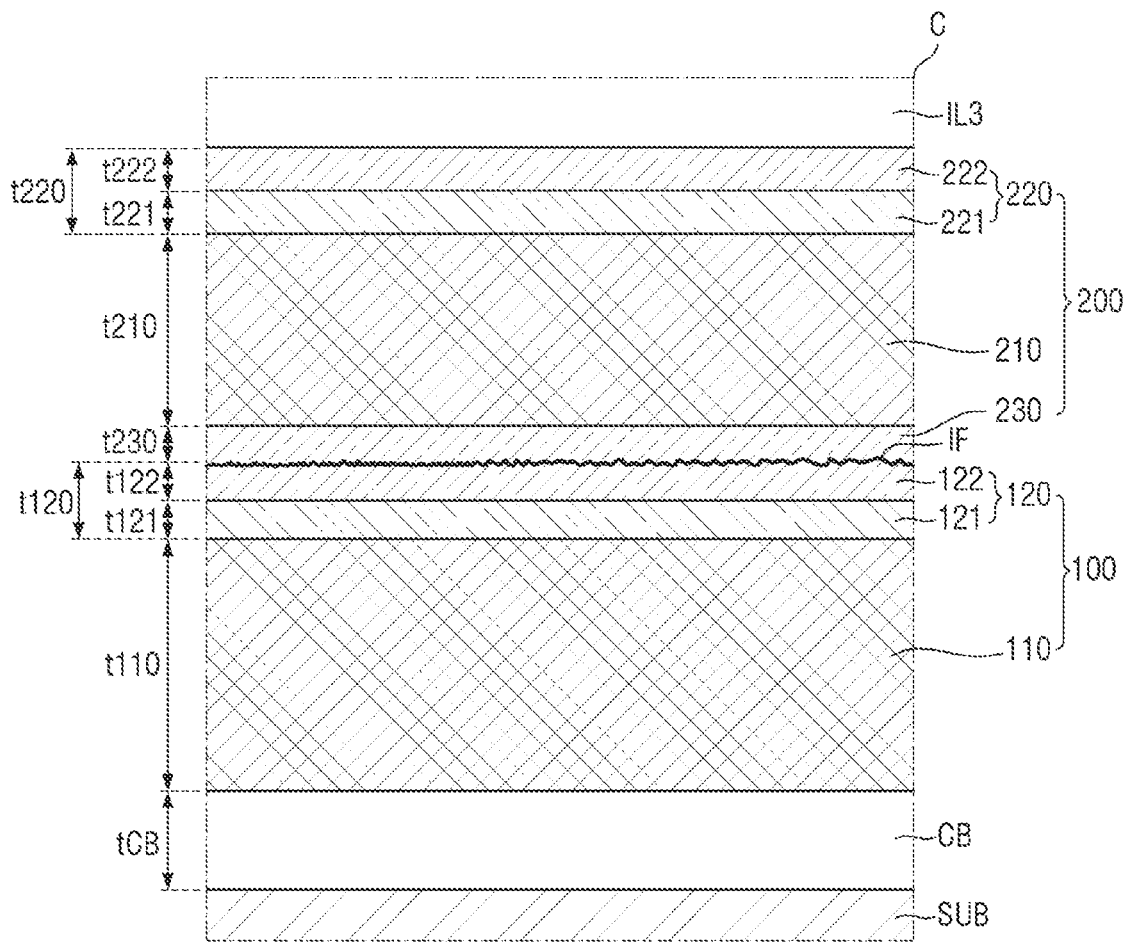
FIG. 7 is an enlarged cross-sectional view of an area C of FIG. 4.

FIG. 5 is an enlarged cross-sectional view of an area A of FIG. 4, FIG. 6 is an enlarged cross-sectional view of an area B of FIG. 4, and FIG. 7 is an enlarged cross-sectional view of an area C of FIG. 4. FIG. 5 illustrates a cross-sectional view of the surroundings of the first lower conductive pattern BML1 as an example first conductive layer 100, and FIG. 6 illustrates a cross-sectional view of the surroundings of the gate electrode GAT1 as an example second conductive layer 200. FIG. 7 illustrates a cross-sectional view of the surroundings of an interface IF between the second lower conductive pattern BML2 of the first conductive layer 100 and the gate electrode GAT2 of the second transistor TR2 of the second conductive layer 200.

The first conductive layer 100 will hereinafter be described with reference to FIG. 5.

The first conductive layer 100 may include the main conductive layer 110 and a capping layer 120, which is disposed on the main conductive layer 110.

The main conductive layer 110 imparts conductivity to the first conductive layer 100. The main conductive layer 110 may be formed of a low-resistance material. The main conductive layer 110 may include (e.g., be) Al or an Al alloy. The Al alloy may include (e.g., be) Al and an additive material. The additive material may include (e.g., be) at least one of Ni, lanthanum (La), Nd, or germanium (Ge). The additive material may be contained in any suitable amount, such as, for example, an amount of 2 at % or 1 at % based on the amount of the whole Al alloy, but the present disclosure is not limited thereto.

A thickness t110 of the main conductive layer 110 may be, for example, 2500 Å to 4000 Å or 2000 Å to 5000 Å, but the present disclosure is not limited thereto.

The main conductive layer 110 may be a single-layer film or a multilayer film. In a case where the main conductive layer 110 is a multilayer film, at least one of multiple films that form the main conductive layer 110 may include (e.g., be) Al or an Al alloy.

The capping layer 120 is disposed on the top surface of the main conductive layer 110. The capping layer 120 may cover the top surface of the main conductive layer 110 to protect the main conductive layer 110. Even if Al (or an Al alloy) is applied to the main conductive layer 110, hillocks of Al can be suppressed, reduced, or prevented, and damage to, and/or defects in, the main conductive layer 110 that may be caused in the process of forming other elements on the main conductive layer 110 can be suppressed, reduced, or prevented. Thus, damage to, and/or defects on, the surface of the first conductive layer 100 or an increase in the resistance of the first conductive layer 100 can be suppressed, reduced, or prevented, and the reliability of the first conductive layer 100 can be improved.

The capping layer 120 may be formed to have a multilayer structure in which heterogenous material layers are stacked. In some embodiments, the capping layer 120 may include a plurality of layers that are stacked. For example, the capping layer 120 may include first and second capping layers 121 and 122. The first and second capping layers 121 and 122 may be formed of different materials.

The first capping layer 121 may be disposed on the main conductive layer 110, and the second capping layer 122 may be disposed on the first capping layer 121. For example, the first capping layer 121 may be disposed between the main conductive layer 110 and the second capping layer 122.

The first and second capping layers 121 and 122, which form the multilayer structure of the capping layer 120, may be formed of a conductive material. The total electrical conductivity of the capping layer 120 may be less than the electrical conductivity of the main conductive layer 110. Each of the first and second capping layers 121 and 122 may include (e.g., be), for example, Ti or titanium nitride (TiN). For example, the capping layer 120 may have a structure in which a TiN layer and a Ti layer are alternately stacked. In some embodiments, the first capping layer 121 may be a TiN layer including (e.g., being) TiN, and the second capping layer 122 may be a Ti layer including (e.g., being) Ti. The TiN layer and the Ti layer are of heterogeneous materials having different physical properties, but can be formed by a continuous process because they both share (e.g., include) Ti. This will be described later in more detail.

The capping layer 120 may have a sufficient thickness to effectively protect the main conductive layer 110, but a thickness t120 of the capping layer 120 may be smaller than the thickness t110 of the main conductive layer 110. For example, the thickness t120 of the capping layer 120 may be half, or less than half, the thickness t110 of the main conductive layer 110.

The thickness t120 of the capping layer 120 may be in the range of 400 Å to 2000 Å. A thickness t121 of the first capping layer 121 may be in the range of 100 Å to 500 Å or 250 Å to 350 Å. A thickness t122 of the second capping layer 122 may be in the range of 1000 Å to 1500 Å or 1100 Å to 1300 Å.

As will be described later, the main conductive layer 110 and the capping layer 120 of the first conductive layer 100 may be formed by a single mask process. Side surfaces of the main conductive layer 110, side surfaces of the first capping layer 121, and side surfaces of the second capping layer 122 may all be aligned, but the present disclosure is not limited thereto. In some embodiments, only two of the main conductive layer 110, the first capping layer 121, and the second capping layer 122 may have their side surfaces aligned, or none of the main conductive layer 110, the first capping layer 121, and the second capping layer 122 may have their side surfaces aligned.

The capping layer 120 has been described above as having a multilayer structure including the first and second capping layers 121 and 122, but the present disclosure is not limited thereto. In some embodiments, the capping layer 120 may have a single-layer structure. In this case, the capping layer 120 may include one of the first and second capping layers 121 and 122, which include (e.g., are) TiN and Ti, respectively. Even if the capping layer 120 includes (e.g., is) only one of the first and second capping layers 121 and 122, the capping layer 120 may have substantially the same thickness as the thickness t120. For example, in this case, the capping layer 120 may have the same composition as the first capping layer 121 or the second capping layer 122, and therefore, the capping layer 120 may include (e.g., be) TiN or Ti.

The stack structure of the second conductive layer 200 and the contact relationship between the first and second conductive layers 100 and 200 will hereinafter be described with reference to FIGS. 6 and 7.

The second conductive layer 200 may include a main conductive layer 210, a capping layer 220, and the barrier layer 230. The capping layer 220 and the barrier layer 230 may be disposed on the main conductive layer 210. The capping layer 220 may be disposed on (e.g., above) the main conductive layer 210, and the barrier layer 230 may be disposed below the main conductive layer 210. For example, the main conductive layer 210 may be disposed between the capping layer 220 and the barrier layer 230. The capping layer 220 may be disposed between the main conductive layer 210 and the third insulating film IL3, and the barrier layer 230 may be disposed between the main conductive layer 210 and the semiconductor layer SCL. In some embodiments, the barrier layer 230 may be disposed between the main conductive layer 210 and the second insulating film IL2.

The main conductive layer 210 of the second conductive layer 200 may be substantially the same (e.g., may have substantially the same composition) as the main conductive layer 110 of the first conductive layer 100, and the capping layer 220 of the second conductive layer 200 may be substantially the same (e.g., may have substantially the same composition) as the capping layer 120 of the first conductive layer 100. For example, the material (e.g., composition), a thickness t210, and the stack structure of the main conductive layer 210 of the second conductive layer 200 may be substantially the same as the material (e.g., composition), the thickness t110, and the stack structure, respectively, of the main conductive layer 110 of the first conductive layer 100. The material, a thickness t220 (t221 and t222), and the stack structure of the capping layer 220 of the second conductive layer 200 may be substantially the same as the material, the thickness t120 (t121 and t122), and the stack structure of the capping layer 120 of the first conductive layer 100. Thus, detailed descriptions of the main conductive layer 210 and the capping layer 220 of the second conductive layer 200 may not be provided.

The second conductive layer 200 may have the same stack structure as the first conductive layer 100 and may further include the barrier layer 230, which is disposed below the corresponding stack structure. The barrier layer 230 may include (e.g., be) the same material as one of first and second capping layers 221 and 222 of the capping layer 220. The barrier layer 230 may be, for example, a Ti layer including (e.g., being) Ti, but the present disclosure is not limited thereto. For example, a thickness t230 of the barrier layer 230 may be in the range of 100 Å to 300 Å or 10 Å to 500 Å.

As the first and second conductive layers 100 and 200 may be in direct contact with each other and the barrier layer 230, which includes (e.g., is) Ti, is disposed at a lowermost part of the second conductive layer 200, the contact resistance in the contact area of the first and second conductive layers 100 and 200 can be reduced, and the bonding of the first and second conductive layers 100 and 200 can be facilitated in the contact area of the first and second conductive layers 100 and 200.

In some embodiments, as the first conductive layer 100 includes the second capping layer 122, which includes (e.g., is) Ti, thereabove (e.g., as an uppermost layer of the first conductive layer 100) and the second conductive layer 200 includes the barrier layer 230, which includes (e.g., is) Ti, therebelow (e.g., as a lowermost layer of the second conductive layer 200), the homogenous materials (i.e., Ti) from the first and second conductive layers 100 and 200 may be in direct contact with each other when the first and second conductive layers 100 and 200 are in direct contact with each other. In some embodiments, the second capping layer 122 of the first conductive layer 100 and the barrier layer 230 of the second conductive layer 200 may be in direct contact with each other. Thus, the contact resistance between the first and second conductive layers 100 and 200 may become lower than when heterogenous materials are in contact with each other at the interface IF where the first and second conductive layers 100 and 200 are in direct contact with each other. For example, the contact resistance between the first and second conductive layers 100 and 200 may be relatively low when the material (e.g., Ti.) at the upper surface of first conductive layer 100 is substantially the same as the material (e.g., Ti) at the lower surface of the second conductive layer 200, compared to when the material at the upper surface of the first conductive layer 100 is different than the material at the lower surface of the second conductive layer 200. Also, when the first and second conductive layers 100 and 200 are in direct contact with, and thereby coupled to, each other, the bonding force between the first and second conductive layers 100 and 200 can be improved because the homogenous materials (e.g., Ti) from the first and second conductive layers 100 and 200 are bonded together.

However, the present disclosure is not limited to this. In some embodiments, during the formation of the contact hole CNT5, part of the second capping layer 122 of the first conductive layer 100 may be over-etched so that the barrier layer 230 of the second conductive layer 200 may be in direct contact with the first capping layer 121 of the first conductive layer 100. Even if the barrier layer 230 of the second conductive layer 200 and the first capping layer 121 of the first conductive layer 100 are in direct contact with each other, the same advantages as those described above can be achieved because the first capping layer 121 of the first conductive layer 100 includes (e.g., is) TiN.

For example, when the gate electrode GAT2 of the second transistor TR2 and the second lower conductive pattern BML2 are in direct contact with each other through the contact hole CNT5, the contact resistance between the gate electrode GAT2 of the second transistor TR2 and the second lower conductive pattern BML2 can be reduced, the bonding force between the gate electrode GAT2 of the second transistor TR2 and the second lower conductive pattern BML2 can be improved, and the device characteristics and the reliability of the second transistor TR2, which is a switching transistor, can be further improved.

The barrier layer 230 may prevent the bottom surface of the main conductive layer 210 of the second conductive layer 200 from being exposed to external air and/or moisture. In some embodiments, the barrier layer 230 may reduce the exposure of the bottom surface of the main conductive layer 210 of the second conductive layer 200 to the external air and/or moisture. The barrier layer 230 covers the top surface of the semiconductor layer SCL and may thus suppress, block, or prevent the diffusion of hydrogen into the channel region of the first transistor TR1 from the semiconductor layer SCL. This will hereinafter be described with reference to FIG. 8.

Figure 8:
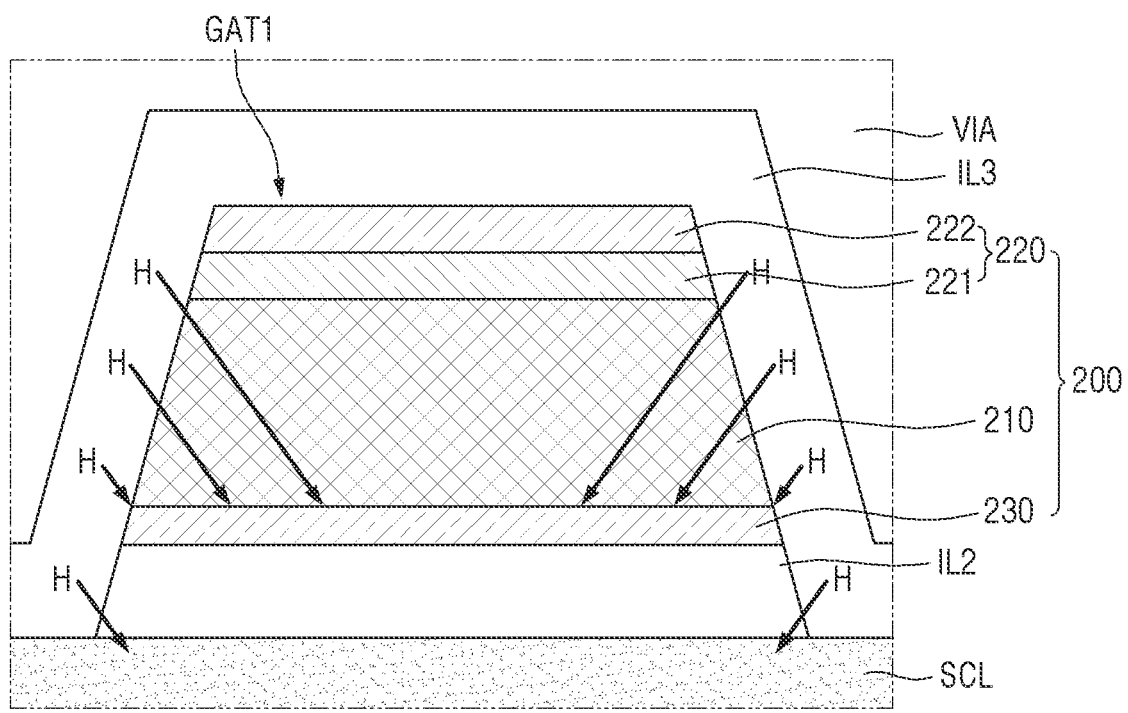
FIG. 8 is a cross-sectional view illustrating how to prevent or reduce the diffusion of hydrogen into a semiconductor layer with a barrier layer according to an embodiment of the present disclosure.

FIG. 8 is a cross-sectional view illustrating how to prevent or block the diffusion of hydrogen into a semiconductor layer with a barrier layer according to an embodiment of the present disclosure. FIG. 8 illustrates a cross-sectional view of the surroundings of the gate electrode GAT1 of the first transistor TR1.

Referring to FIG. 8, the barrier layer 230 may block hydrogen H that may proceed toward the semiconductor layer SCL. In other words, the hydrogen H may diffuse toward the semiconductor layer SCL through the main conductive layer 210 and the second insulating film IL2, but may not be able to pass through the barrier layer 230. The barrier layer 230 may allow the hydrogen H infiltrated thereinto to remain therein without releasing the hydrogen H. Thus, the barrier layer 230 can suppress, reduce, or prevent the diffusion of the hydrogen H.

The barrier layer 230 may be disposed above part of the semiconductor layer SCL corresponding to the channel region of the first transistor TR1 and may overlap with the channel region of the first transistor TR1. Accordingly, the barrier layer 230 can reduce, suppress, or prevent the diffusion of the hydrogen H into the channel region of the first transistor TR1. For example, even if the main conductive layer 210 of the gate electrode GAT1 of the first transistor TR1 includes (e.g., is) Al, the amount of hydrogen H infiltrating into the channel region of the first transistor TR1 can be reduced or minimized due to the presence of the barrier layer 230 below the main conductive layer 210 (for example, between the main conductive layer 210 and the semiconductor layer SCL), and as a result, the reliability of the first transistor TR1 can be secured (e.g., improved).

It will hereinafter be described, with reference to FIG. 9, how to secure the reliability of a transistor with the utilization (e.g., use) of the barrier layer 230.

Figure 9:
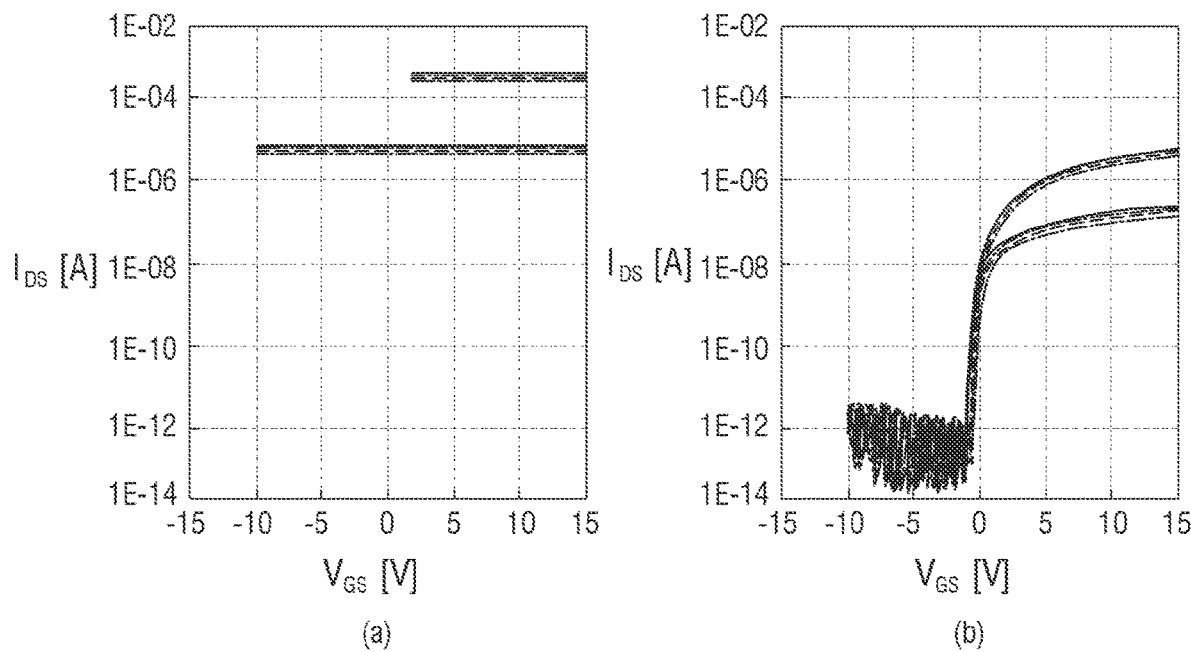
FIG. 9 shows graphs (a) and (b), which show the variation of a driving current depending on the presence of the barrier layer of FIG. 8.

FIG. 9 shows graphs (a) and (b) showing the variation of a driving current depending on the presence of the barrier layer of FIG. 8. Graph (a) of FIG. 9 shows the variation of a driving current Ids in accordance with a gate voltage Vgs of a transistor when the second conductive layer 200 does not include the barrier layer 230, and graph (b) of FIG. 9 shows the variation of the driving current Ids in accordance with the gate voltage Vgs of the transistor when the second conductive layer 200 includes the barrier layer 230. Here, the transistor includes a gate electrode that includes Al.

Referring to graph (a) of FIG. 9, when the barrier layer 230 is not provided, the driving current Ids does not change even though the gate voltage Vgs of the transistor changes. That is, when the barrier layer 230 is not provided, a large amount of hydrogen may infiltrate into the channel region of the transistor so that the electrical resistance of the channel region of the transistor may decrease, regardless of whether the gate electrode of the transistor includes (e.g., is) Al to realize low resistance. Thus, it is difficult to control the turning on or off of the transistor, and as a result, the reliability of the transistor may not be secured.

Referring to graph (b) of FIG. 9, as the gate voltage Vgs of the transistor changes, the driving current Ids changes so that the transistor may have a threshold voltage Vth of about 0.24 V. In some embodiments, when the gate electrode of the transistor includes the barrier layer 230, as illustrated in FIG. 6, the barrier layer 230 can block hydrogen that proceeds toward the channel region of the transistor and can thus minimize or reduce a variation in the electrical resistance of the channel region of the transistor. Thus, the turning on or off of the transistor can be facilitated, and as a result, the reliability of the transistor can be secured.

In other words, even if the gate electrode of the transistor includes (e.g., is) Al, the diffusion of hydrogen into the channel region of the transistor can be reduced, suppressed, or prevented due to the presence of the barrier layer 230, as illustrated in FIG. 6. Thus, the gate electrode of the transistor can be maintained at low resistance, and the turning on or off of the transistor can be easily controlled, thereby securing the reliability of the transistor.

A method of fabricating a display device according to an embodiment of the present disclosure will hereinafter be described.

FIGS. 10 through 12A are cross-sectional views illustrating a method of fabricating a display device according to an embodiment of the present disclosure. FIG. 12B is a partial schematic plan view illustrating some of the features of FIG. 12A. FIGS. 10 through 12A illustrate how to fabricate the second conductive layer 200 of FIG. 6. The fabrication of other elements of the display device 1 of FIG. 1 is already generally available, and thus, a detailed description thereof may not be provided.

Figure 10:
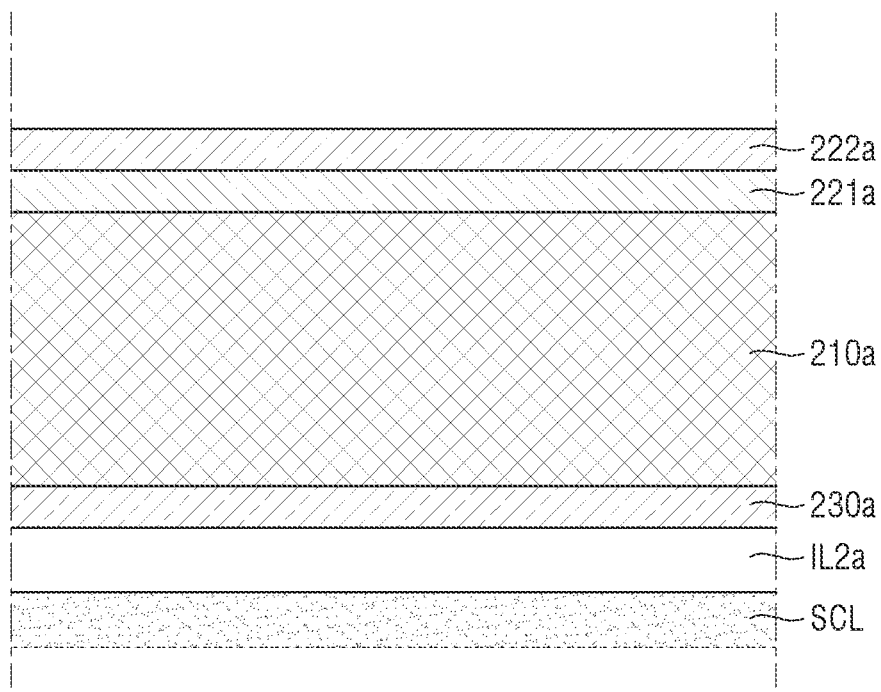

Referring first to FIG. 10, a barrier layer material layer 230a, which includes (e.g., is) Ti, a main conductive layer material layer 210a, which includes (e.g., is) Al or an Al alloy, a first capping layer material layer 221a, and a second capping layer material layer 222a are sequentially formed on the semiconductor layer SCL. In some embodiments, a second insulating film material layer IL2a is formed on the semiconductor layer SCL and then the barrier layer material layer 230a is formed on the second insulating film material layer IL2a. The barrier layer material layer 230a, the main conductive layer material layer 210a, the first capping layer material layer 221a, and the second capping layer material layer 222a may be formed on the entire surface of the base substrate SUB (of FIG. 4) or of the first insulating film IL1 (of FIG. 4) to cover the semiconductor layer SCL.

The barrier layer material layer 230a, the main conductive layer material layer 210a, the first capping layer material layer 221a, and the second capping layer material layer 222a may be formed by sputtering utilizing a sputtering device (e.g., by performing sputtering in a sputtering device). The barrier layer material layer 230a, the main conductive layer material layer 210a, the first capping layer material layer 221a, and the second capping layer material layer 222a may be formed in different sputtering devices, or at least some of the barrier layer material layer 230a, the main conductive layer material layer 210a, the first capping layer material layer 221a, and the second capping layer material layer 222a may be formed by a continuous sputtering method.

For example, the first capping layer material layer 221a and the second capping layer material layer 222a may be formed by a continuous sputtering method.

In some embodiments, the base substrate SUB with the main conductive layer material layer 210a formed thereon may be placed in a sputtering device including a Ti target. Thereafter, the first capping layer material layer 221a, which includes (e.g., is) TiN, is formed by performing reactive sputtering with the utilization (e.g., use) of a nitrogen gas as a sputtering gas.

Then, the nitrogen gas is replaced with an argon gas in the sputtering device, and sputtering is continued, thereby forming the second capping layer material layer 222a, which includes (e.g., is) Ti.

Figure 11:
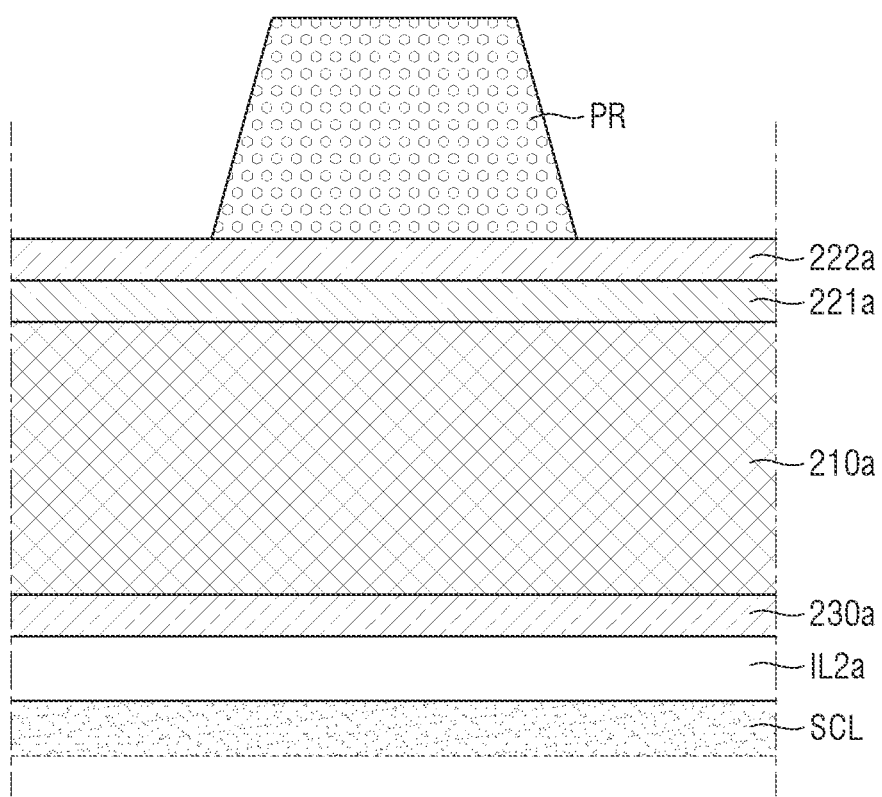
Figure 12A:
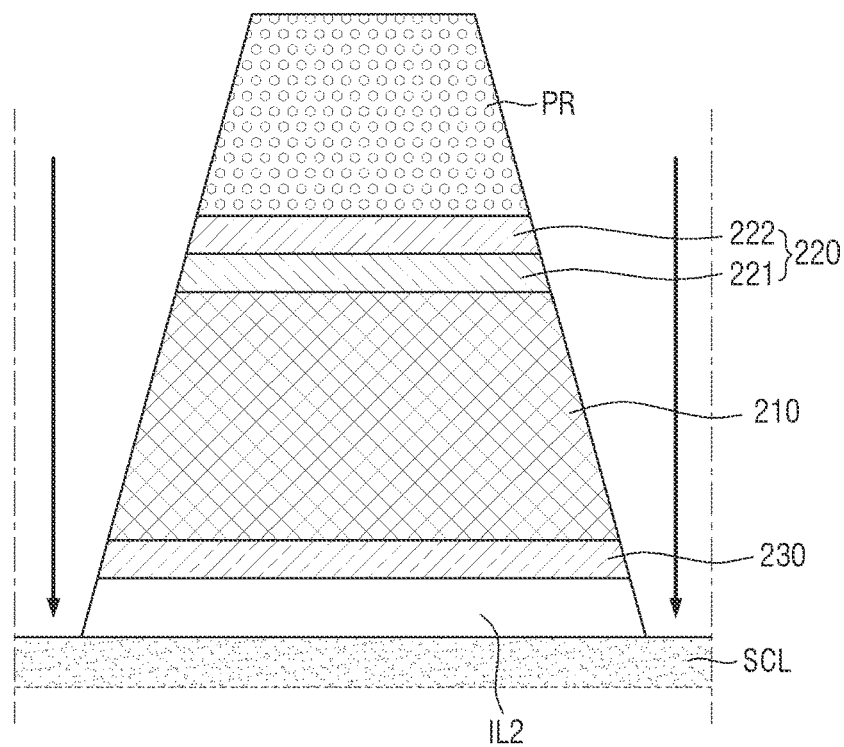
Figure 12B:
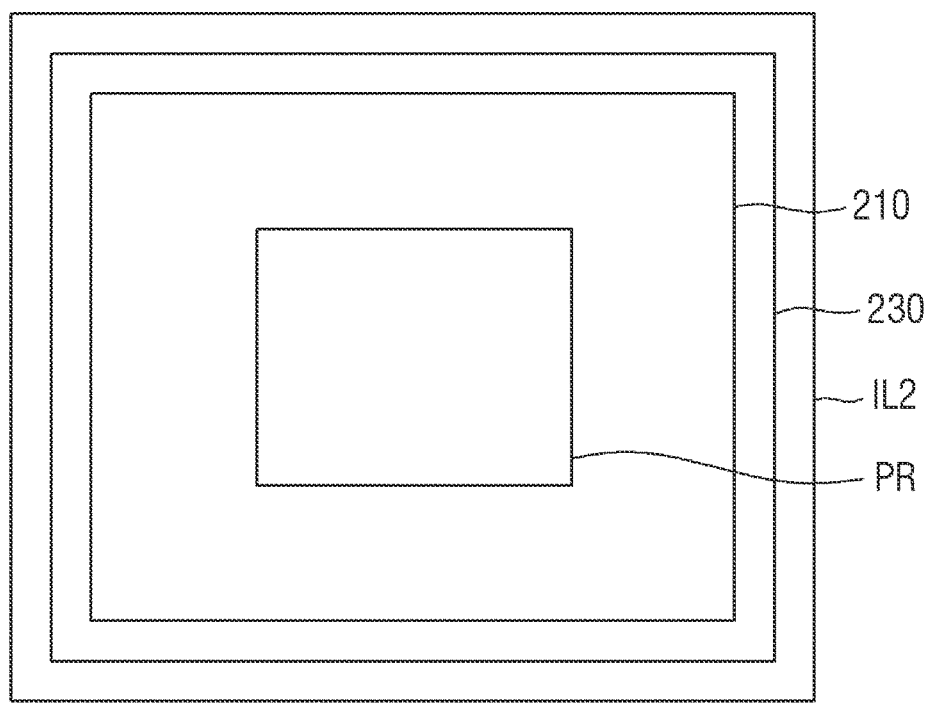
FIG. 12B is a partial schematic plan view illustrating some of the features of FIG. 12A.

Referring to FIGS. 11, 12A and 12B, a photoresist pattern PR is formed on the second capping layer material layer 222a, and the barrier layer material layer 230a, the main conductive layer material layer 210a, the first capping layer material layer 221a, and the second capping layer material layer 222a are etched utilizing (e.g., using) the photoresist pattern PR as an etching mask.

The etching of the barrier layer material layer 230a, the main conductive layer material layer 210a, the first capping layer material layer 221a, and the second capping layer material layer 222a with the utilization (e.g., use) of the photoresist pattern PR as an etching mask is performed. The barrier layer material layer 230a, the main conductive layer material layer 210a, the first capping layer material layer 221a, and the second capping layer material layer 222a may be etched by dry etching. The barrier layer material layer 230a, the main conductive layer material layer 210a, the first capping layer material layer 221a, and the second capping layer material layer 222a may be sequentially etched in the same batch or in different batches by different etching processes with different sets of etching conditions. In some embodiments, the second capping layer material layer 222a may be etched first, then the first capping layer material layer 221a may be etched, then the main conductive layer material layer 210a may be etched, and then the barrier layer material layer 230a may be etched.

Thus, the barrier layer 230, the main conductive layer 210, and the capping layer 220 are etched by a single mask process, and even if the barrier layer 230 is provided, the number of mask processes does not increase. As a result, even if the barrier layer 230 is provided, process efficiency may not be lowered.

The second insulating film IL2 may be etched together with the second conductive layer 200 with the utilization (e.g., use) of a single mask. In some embodiments, the second insulating film IL2 may be formed by etching the second insulating film material layer IL2a utilizing (e.g., using) the photoresist pattern PR. Therefore, in some embodiments, the barrier layer 230 may have a substantially same shape as the main conductive layer 210 in a plan view, and the barrier layer 230 may have a substantially same shape as the second insulating film IL2 in the plan view, for example, as schematically illustrated in FIG. 12B.

Thereafter, the second conductive layer 200 of FIG. 6 may be obtained by removing the remaining photoresist pattern PR via ashing or stripping.

Display devices according to other embodiments of the present disclosure will hereinafter be described, focusing mainly on the differences with the display device 1. Descriptions of elements or features that have already been described may be simplified or may not be repeated.

Figure 13:
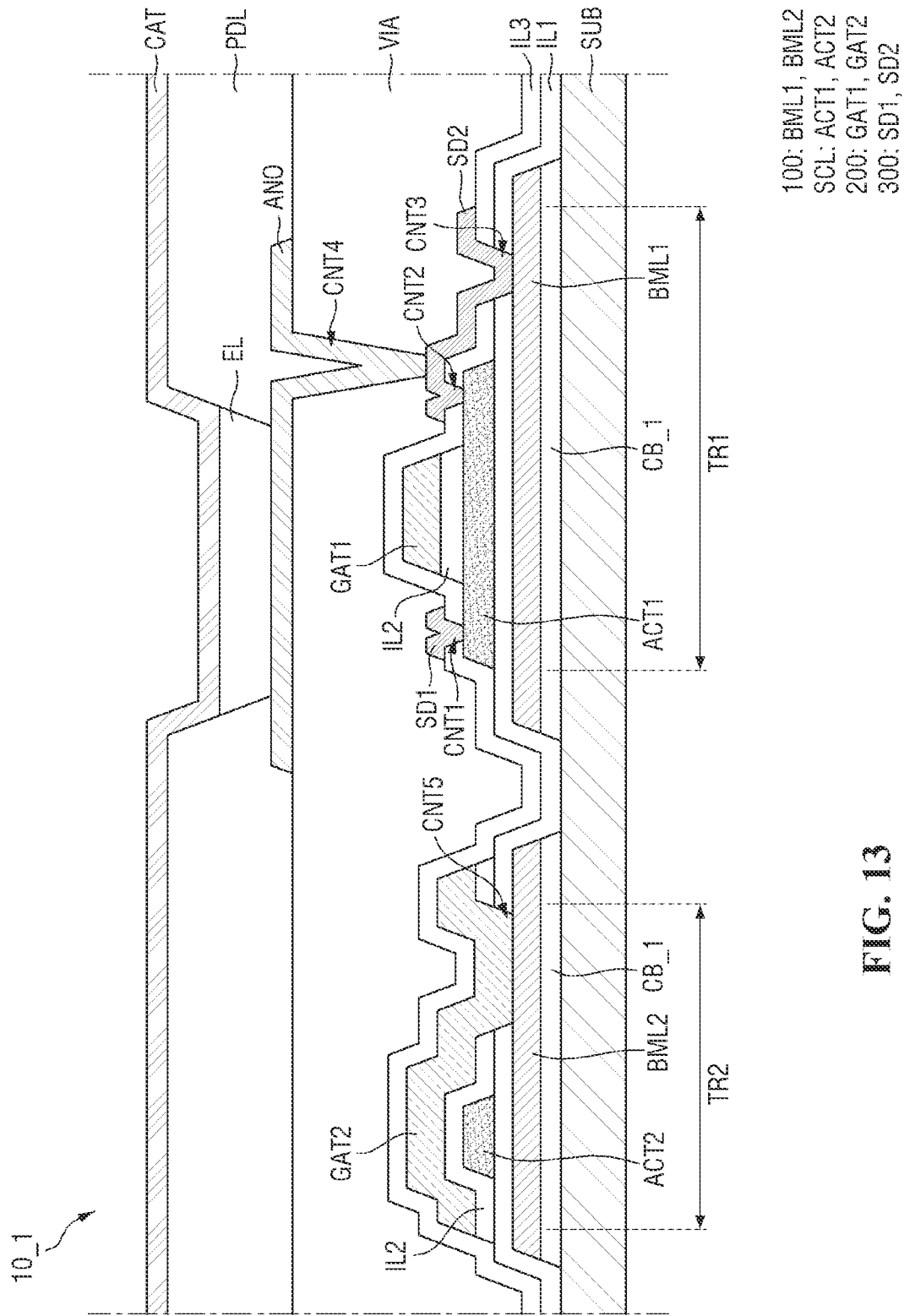
FIG. 13 is a cross-sectional view of a display device according to another embodiment of the present disclosure.

FIG. 13 is a cross-sectional view of a display device according to another embodiment of the present disclosure.

Referring to FIG. 13, the embodiment of FIG. 13 differs from the embodiment of FIG. 4 in that a corrosion prevention layer CB_1 of a display panel 10_1 has the same pattern as a first conductive layer 100.

In some embodiments, the display panel 10_1 includes the corrosion prevention layer CB_1, which is disposed on a base substrate SUB, and the first conductive layer 100, which is disposed on the corrosion prevention layer CB_1, and the corrosion prevention layer CB_1 and the first conductive layer 100 may be formed into substantially the same pattern in a plan view and may overlap with each other. Side surfaces of the corrosion prevention layer CB_1 are aligned with side surfaces of the first conductive layer 100, but the present disclosure is not limited thereto.

In this case, the corrosion prevention layer CB_1 may cover the entire bottom surface of the first conductive layer 100. Because the corrosion prevention layer CB_1 is disposed below the first conductive layer 100, the corrosion of the first conductive layer 100 can be prevented or reduced, even if the first conductive layer 100 includes (e.g., is) Al or an Al alloy, and the display quality and the reliability of the display device of FIG. 13 can be secured.

Figure 14:
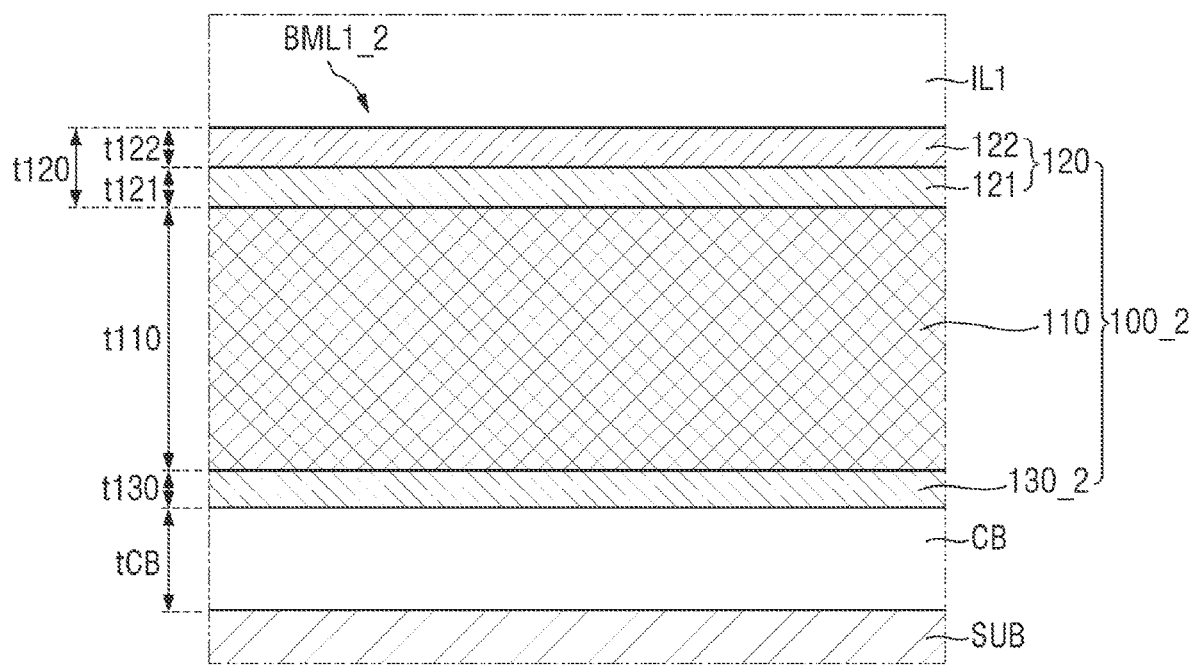
FIG. 14 is a cross-sectional view of a display device according to another embodiment of the present disclosure.

FIG. 14 is a cross-sectional view of a display device according to another embodiment of the present disclosure. FIG. 14 illustrates a cross-sectional view of the surroundings of a first lower conductive pattern BML1_2 as an example first conductive layer 100_2.

Referring to FIG. 14, the embodiment of FIG. 14 differs from the embodiment of FIG. 5 in that the first conductive layer 100_2 has substantially the same stack structure as the second conductive layer 200 of FIG. 6.

For example, the first conductive layer 100_2 may include a main conductive layer 110 and a capping layer 120, which is disposed on the main conductive layer 110, and may further include a sub-barrier layer 130_2, which is disposed below the main conductive layer 110.

The sub-barrier layer 130_2 of the first conductive layer 100_2 may be substantially the same as the barrier layer 230 of the second conductive layer 200 of FIG. 6. For example, the sub-barrier layer 130_2 of the first conductive layer 100_2 may include (e.g., be) Ti and may be disposed below the main conductive layer 110 of the first conductive layer 100_2. The sub-barrier layer 130_2 of the first conductive layer 100_2 may be disposed between the main conductive layer 110 of the first conductive layer 100_2 and the base substrate SUB and/or between the main conductive layer 110 and a corrosion prevention layer CB. The main conductive layer 110 of the first conductive layer 100_2 may be disposed between the sub-barrier layer 130_2 of the first conductive layer 100_2 and the capping layer 120 of the first conductive layer 100_2.

In this case, not only the corrosion prevention layer CB, but also the sub-barrier layer 130_2, is further disposed below the main conductive layer 110 of the first conductive layer 100_2, and thus, the diffusion of moisture and/or external air to the main conductive layer 110 of the first conductive layer 100_2 can be properly blocked. As a result, the oxidation and/or corrosion of the main conductive layer 110 can be further suppressed, reduced, or prevented.

Figure 15:
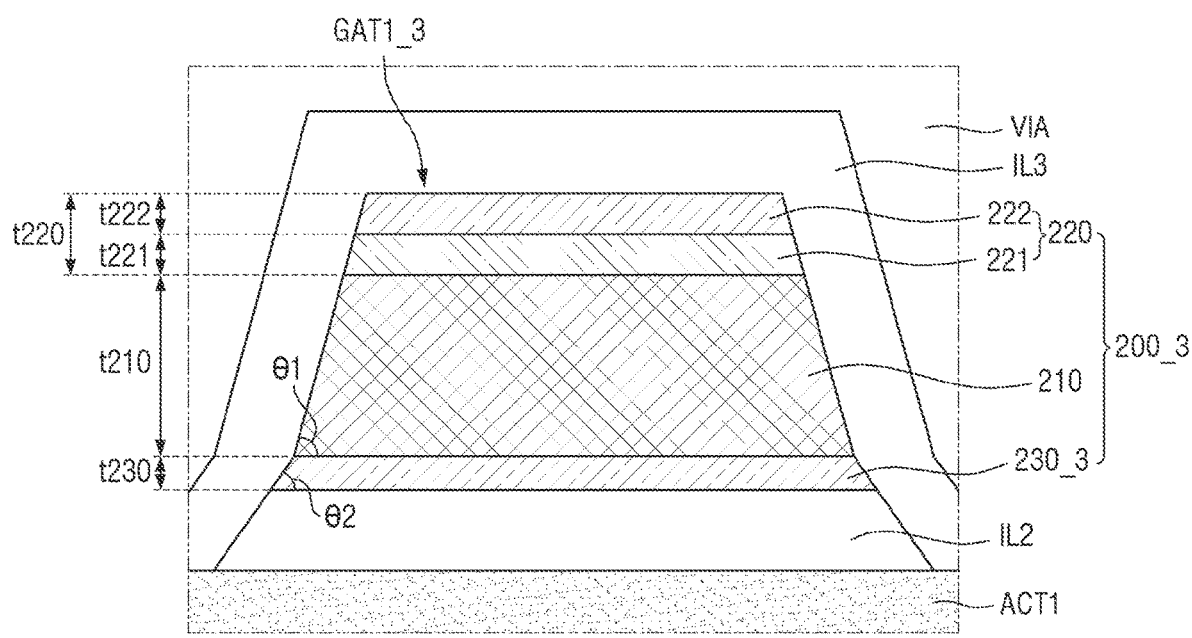
FIG. 15 is a cross-sectional view of a display device according to another embodiment of the present disclosure.

FIG. 15 is a cross-sectional view of a display device according to another embodiment of the present disclosure. FIG. 15 illustrates a cross-sectional view of the surroundings of a gate electrode GAT1_3 of a first transistor TR1 (see FIGS. 3 and 4) as an example second conductive layer 200_3.

Referring to FIG. 15, the embodiment of FIG. 15 differs from the embodiment of FIG. 6 in that a barrier layer 230_3 and a main conductive layer 210 of the second conductive layer 200_3 have different taper angles, i.e., taper angles 81 and 82, respectively.

In some embodiments, the second conductive layer 200_3 may include a main conductive layer 210, a capping layer 220, which is disposed on the main conductive layer 210, and a barrier layer 230_3, which is disposed below the main conductive layer 210, and the taper angle 82 of the barrier layer 230_3 of the second conductive layer 200_3 may differ from the taper angle 81 of the main conductive layer 210 of the second conductive layer 200_3. In some embodiments, the taper angle 81 of the main conductive layer 210 is an acute angle of a side (e.g., side wall or side surface) of the main conductive layer 210 relative to a lower surface of the main conductive layer 210, and the taper angle 82 of the barrier layer 230_3 is an acute angle of a side (e.g., side wall or side surface) of the barrier layer 230_3 relative to a lower surface of the barrier layer 230_3. The taper angle 82 of the barrier layer 230_3 of the second conductive layer 200_3 may be smaller than the taper angle 81 of the main conductive layer 210 of the second conductive layer 200_3.

Even in this case, the barrier layer 230_3 of the second conductive layer 200_3 can minimize or reduce the diffusion of hydrogen into the channel region of a TFT and can thus secure the reliability of a TFT.

Figure 16:
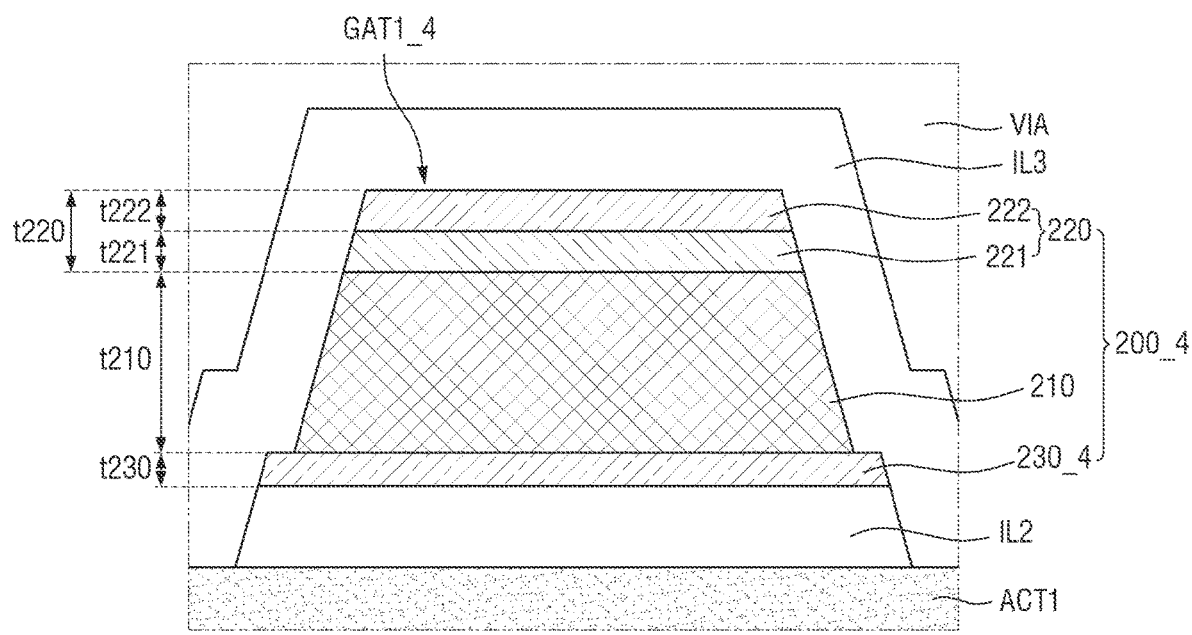
FIG. 16 is a cross-sectional view of a display device according to another embodiment of the present disclosure.

FIG. 16 is a cross-sectional view of a display device according to another embodiment of the present disclosure. FIG. 16 illustrates a cross-sectional view of the surroundings of a gate electrode GAT1_4 of a first transistor TR1 (see FIGS. 3 and 4) as an example second conductive layer 200_4.

Referring to FIG. 16, the embodiment of FIG. 16 differs from the embodiment of FIG. 6 in that side surfaces of a barrier layer 230_4 of the second conductive layer 200_4 are not aligned with side surfaces of a main conductive layer 210 of the second conductive layer 200_4.

In some embodiments, the side surfaces of the barrier layer 230_4 of the second conductive layer 200_4 may protrude outwardly from the side surfaces of the main conductive layer 210 of the second conductive layer 200_4. For example, in a plan view, the side surfaces of the barrier layer 230_4 may extend past the side surfaces of the main conductive layer 210 such that a portion of the barrier layer 230_4 overhangs the main conductive layer 210. However, the present disclosure is not limited thereto. In some embodiments, the side surfaces of the main conductive layer 210 of the second conductive layer 200_4 may protrude outwardly from the side surfaces of the barrier layer 230_4 of the second conductive layer 200_4. For example, in a plan view, the side surfaces of the main conductive layer 210 may extend past the side surfaces of the barrier layer 230_4 such that a portion of the main conductive layer 210 overhangs the barrier layer 230_4.

Even in this case, the barrier layer 230_4 of the second conductive layer 200_4 can minimize or reduce the diffusion of hydrogen into the channel region of a TFT and can thus secure the reliability of a TFT.

In concluding the detailed description, those or ordinary skill in the art will appreciate that many variations and suitable modifications can be made to the disclosed embodiments without substantially departing from the principles and scope of the present disclosure, as defined by the claims and equivalents thereof. Therefore, the disclosed embodiments of the present disclosure are used in a generic and descriptive sense only and not for purposes of limitation.

What is claimed is:

1. A display device comprising:
   a substrate;
   a corrosion prevention layer on the substrate and comprising silicon nitride;
   a first conductive layer on the corrosion prevention layer and comprising aluminum or an aluminum alloy;
   a first insulating film comprising silicon oxide and silicon nitride on the first conductive layer;
   a semiconductor layer on the first insulating film and comprising a channel region of a transistor;
   a second insulating film comprising silicon oxide on the semiconductor layer;
   a second conductive layer on the second insulating film and comprising a barrier layer, which comprises titanium, and a main conductive layer, which comprises aluminum or an aluminum alloy;
   a capping layer on the main conductive layer and comprising at least one of titanium or a titanium compound;
   a third insulating film on the second conductive layer; and
   a third conductive layer on the third insulating film,
   wherein the semiconductor layer comprises an oxide semiconductor,
   wherein the barrier layer is between the semiconductor layer and the main conductive layer and overlaps the channel region of the transistor,
   wherein the third conductive layer comprises a source electrode and a drain electrode of the transistor,
   wherein the second conductive layer comprises a gate electrode of the transistor,
   wherein a thickness of the corrosion prevention layer is in a range of 1000 Å to 2000 Å, and
   wherein a thickness of the main conductive layer is in a range of 2500 Å to 4000 Å.

2. The display device of claim 1, wherein the source electrode of the transistor is electrically connected to both the semiconductor layer and the first conductive layer.

3. The display device of claim 2, wherein the third conductive layer further comprises a first power supply voltage line.

4. The display device of claim 1, wherein the second conductive layer is electrically connected to the first conductive layer through a contact hole that exposes the first conductive layer, and
   wherein the second conductive layer is in direct contact with the first conductive layer.

5. The display device of claim 1, wherein the first conductive layer further comprises a metal pattern comprising titanium as a top layer of the first conductive layer.

6. The display device of claim 1, wherein the barrier layer has the same shape as the main conductive layer in a plan view.

7. The display device of claim 6, wherein the barrier layer has the same shape as the second insulating film in the plan view.

8. The display device of claim 7, wherein side surfaces of the barrier layer, side surfaces of the main conductive layer, and side surfaces of the second insulating film are aligned.

9. The display device of claim 1, wherein a thickness of the barrier layer is in a range of 100 Å to 300 Å.

10. A display device comprising:
a substrate;
a semiconductor layer on the substrate and comprising a channel region of a transistor;
a first insulating film on the semiconductor layer;
a first conductive layer on the first insulating film and comprising a barrier layer, which comprises titanium, a main conductive layer, which comprises aluminum or an aluminum alloy, and a capping layer, which comprises titanium;
a second insulating film on the first conductive layer; and
a second conductive layer on the second insulating film and comprising a source electrode and a drain electrode of the transistor,
wherein:
the semiconductor layer comprises an oxide semiconductor,
the first conductive layer comprises a gate electrode of the transistor,
the barrier layer is between the semiconductor layer and the main conductive layer and overlaps the channel region of the transistor, and
wherein a thickness of the main conductive layer is in a range of 2500 Å to 4000 Å.

11. The display device of claim 10, further comprising:
an inorganic material film comprising silicon nitride on the substrate;
a third conductive layer on the an inorganic material film and comprising aluminum or an aluminum alloy; and
a third insulating film on the third conductive layer,
wherein the inorganic material film, the third conductive layer, and the third insulating film are between the substrate and the semiconductor layer,
wherein a thickness of the inorganic material film is in a range of 1000 Å to 2000 Å, and
wherein a thickness of the barrier layer is in a range of 100 Å to 300 Å.

12. The display device of claim 11, wherein the third conductive layer comprises a lower conductive pattern, which overlaps the channel region of the transistor.

13. The display device of claim 12, wherein the lower conductive pattern is electrically connected to the gate electrode of the transistor.

14. The display device of claim 13, wherein the barrier layer has the same shape as the main conductive layer in a plan view.

15. The display device of claim 14, wherein the barrier layer has the same shape as the first insulating film in the plan view.

16. The display device of claim 15, wherein side surfaces of the barrier layer, side surfaces of the main conductive layer, and side surfaces of the first insulating film are aligned.

* * * * *